US 12,072,622 B2

United States Patent
Miyoshi et al.

(10) Patent No.: US 12,072,622 B2
(45) Date of Patent: Aug. 27, 2024

(54) IMPRINT METHOD, METHOD OF MANUFACTURING SEMICONDUCTOR DEVICE, AND IMPRINT DEVICE

(71) Applicant: KIOXIA CORPORATION, Tokyo (JP)

(72) Inventors: Hirokazu Miyoshi, Yokkaichi Mie (JP); Masayuki Hatano, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/897,030

(22) Filed: Aug. 26, 2022

(65) Prior Publication Data
US 2023/0288797 A1 Sep. 14, 2023

(30) Foreign Application Priority Data
Mar. 11, 2022 (JP) .................. 2022-037870

(51) Int. Cl.
*G03F 7/00* (2006.01)
*H01L 21/02* (2006.01)

(52) U.S. Cl.
CPC ...... *G03F 7/0002* (2013.01); *H01L 21/02348* (2013.01)

(58) Field of Classification Search
None
See application file for complete search history.

(56) References Cited

U.S. PATENT DOCUMENTS

| 11,036,149 B2 | 6/2021 | Matsuoka et al. |
| 2016/0214312 A1 | 7/2016 | Hirano |
| 2019/0265589 A1 | 8/2019 | Nakagawa |

FOREIGN PATENT DOCUMENTS

| JP | 5868215 B2 * | 2/2016 | ........... B29C 59/026 |
| JP | 2016092198 A | 5/2016 | |
| JP | 6537277 B2 | 7/2019 | |
| JP | 6603678 B2 | 11/2019 | |
| JP | 6700777 B2 | 5/2020 | |
| JP | 6735656 B2 | 8/2020 | |

OTHER PUBLICATIONS

Machine translation Emoto et al_JP_5868215_B2_I (Year: 2016).*

* cited by examiner

*Primary Examiner* — Robert J Grun
(74) *Attorney, Agent, or Firm* — Kim & Stewart LLP

(57) ABSTRACT

According to one embodiment, an imprint method for a substrate having a plurality of shot regions includes performing a first process on each target shot region in the plurality of shot regions and performing a second process on a non-target shot region in the plurality of shot regions. The first process includes pressing a template against resin in the target shot region to transfer a pattern to the resin, curing the resin, and releasing the template from the cured resin while supplying inert gas towards the substrate from an outer edge side of the template. The second process includes causing the template to approach the non-target shot region without coming into contact with resin in the non-target shot region, and moving the template away from the resin in the non-target shot region while supplying inert gas towards the substrate from the outer edge side of the template.

20 Claims, 21 Drawing Sheets

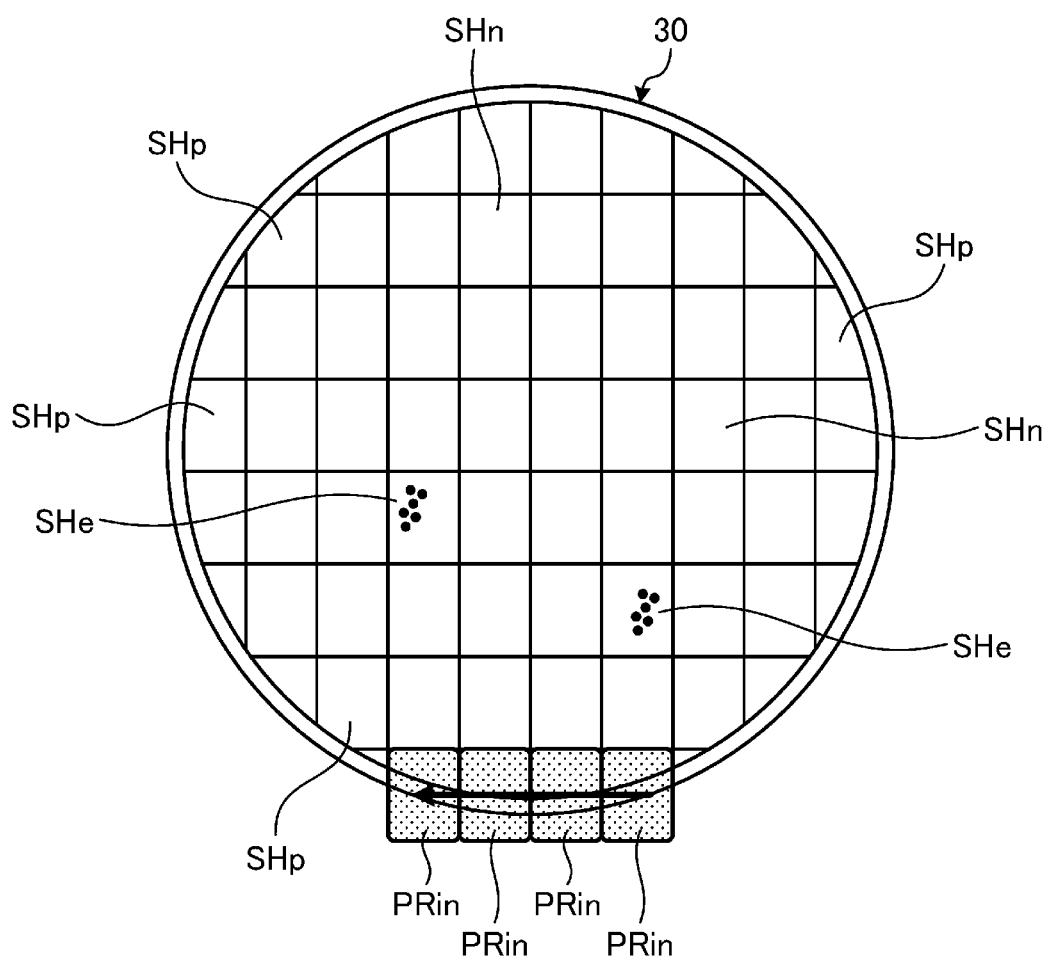

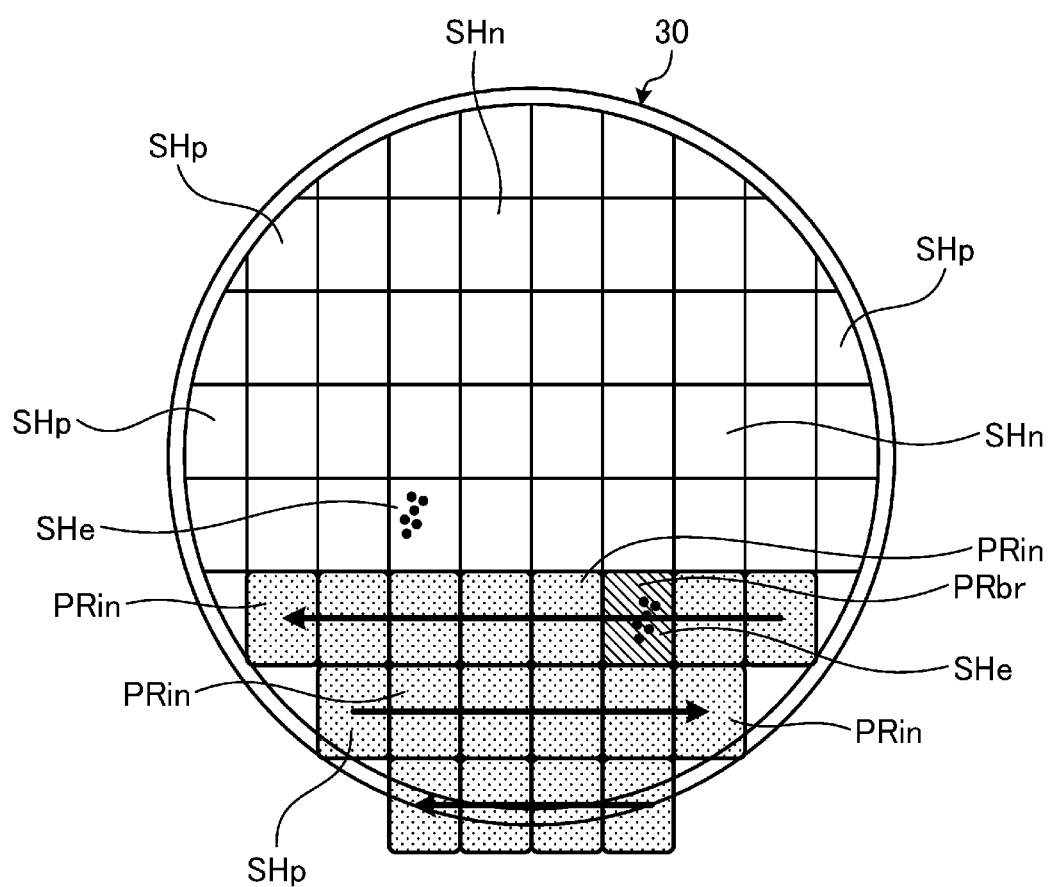

ial No. 2022-037870,
IMPRINT METHOD, METHOD OF MANUFACTURING SEMICONDUCTOR DEVICE, AND IMPRINT DEVICE

CROSS-REFERENCE TO RELATED APPLICATION

This application is based upon and claims the benefit of priority from Japanese Patent Application No. 2022-037870, filed Mar. 11, 2022, the entire contents of which are incorporated herein by reference.

FIELD

Embodiments described herein relate generally to an imprint method, a method of manufacturing a semiconductor device, and an imprint device.

BACKGROUND

A manufacturing process of a semiconductor device may include an imprint process. In the imprint process, a template may be pressed against a resin on a substrate to transfer a pattern of the template to the substrate or the like. Typically, inert gas or the like is supplied during this process from an outer edge side of the template to prevent bubbles from being mixed into the resin.

BRIEF DESCRIPTION OF THE DRAWINGS

FIG. 4 depicts aspects of a method of manufacturing a semiconductor device according to the first embodiment.

FIG. 8 depicts aspects of a method of manufacturing a semiconductor device according to the first embodiment.

DETAILED DESCRIPTION

Embodiments imprint method, a method of manufacturing a semiconductor device, and an imprint device that can reduce pattern formation failures.

In general, according to one embodiment, an imprint method for a substrate having a plurality of shot regions includes performing a first process on each target shot region in the plurality of shot regions and performing a second process on a non-target shot region in the plurality of shot regions. The first process includes pressing a template against resin in the target shot region to transfer a pattern to the resin, curing the resin, and releasing the template from the cured resin while supplying inert gas towards the substrate from an outer edge side of the template. The second process includes causing the template to approach the non-target shot region without coming into contact with resin in the non-target shot region, and moving the template away from the resin in the non-target shot region while supplying inert gas (such as helium or carbon dioxide) towards the substrate from the outer edge side of the template.

Hereinafter, aspects of the present disclosure will be described with reference to the drawings. It is noted that the present disclosure is not limited to the following embodiments. Further, components of the following embodiments include components that can be easily assumed by those skilled in the art or components that are substantially the same.

First Embodiment

A first embodiment will be described.
Configuration Example of Imprint Device

Figure 1A:
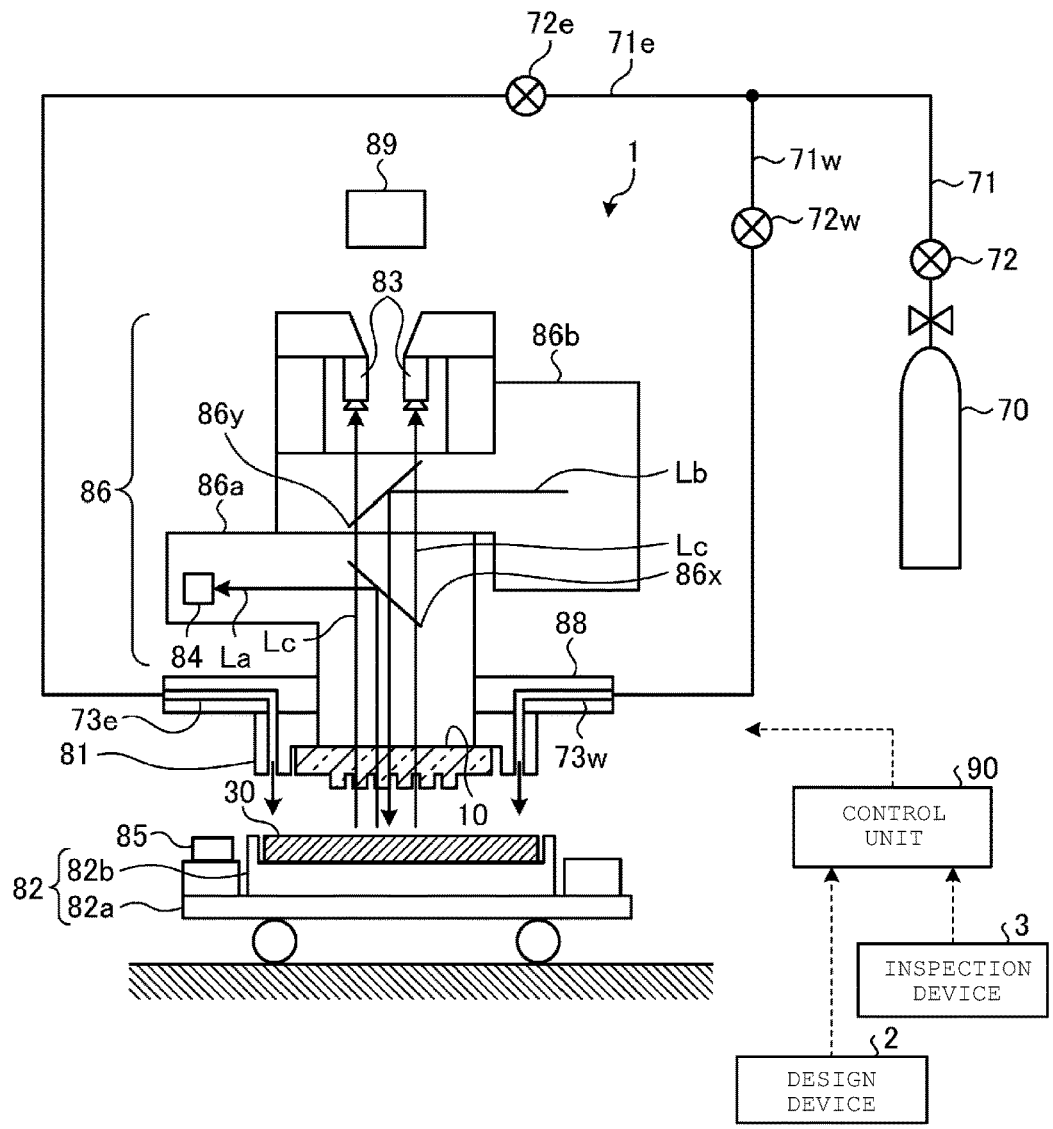
FIGS. 1A and 1B are views illustrating an example of a configuration of an imprint device according to a first embodiment.
Figure 1B:
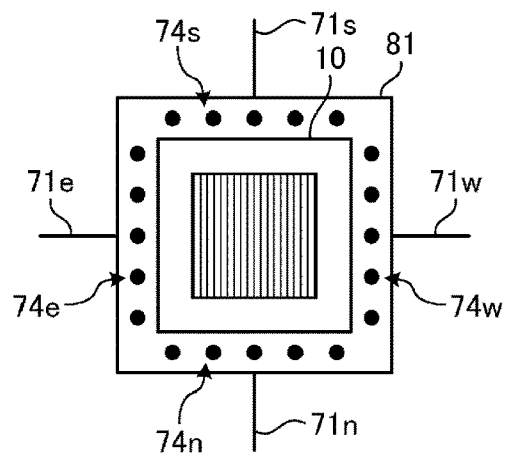

FIGS. 1A and 1B are views illustrating an example of a configuration of an imprint device 1 according to a first embodiment. FIG. 1A is a schematic view illustrating an overall configuration of the imprint device 1, and FIG. 1B is a top view of a template stage 81 provided in the imprint device 1 as viewed from below.

As illustrated in FIGS. 1A and 1B, the imprint device 1 includes a template stage 81, a wafer stage 82, an alignment scope 83, a spread scope 84, a reference mark 85, an alignment unit 86, a stage base 88, a light source 89, a supply pipe 71, a valve 72, a gas flow path 73, a gas hole 74, and a control unit 90.

Further, a template 10 for transferring a pattern to a resist on a wafer 30 is installed in the imprint device 1. The template 10 is a transparent material such as quartz and is disposed with a pattern on the wafer stage 82 side.

Further, the control unit 90 of the imprint device 1 can be connected to a design device 2 and an inspection device 3 to acquire various types of information.

At the beginning of a manufacturing process of a semiconductor device, the design device 2 provides a design of the semiconductor device and designs layouts of circuit wiring and other elements of the semiconductor device, a layout of the semiconductor device on a wafer, and the like. The design device 2 transmits, for example, various types of layout information for the wafer 30 to be imprinted/patterned by an imprint process to the control unit 90 of the imprint device 1.

The inspection device 3 performs an inspection on the wafer 30 before the imprint process begins. The inspection device 3 transmits an inspection result for the wafer 30 to the control unit 90 of the imprint device 1. A plurality of inspection devices 3 that transmit various inspection results may be connected to the control unit 90 of the imprint device 1.

The wafer stage 82 of the imprint device 1 includes a wafer chuck 82b and a main body 82a. The wafer chuck 82b holds the template 10 in a recess portion provided on an upper surface and fixes the wafer 30 at a predetermined position on the main body 82a. The upper surface of the wafer chuck 82b is disposed at substantially the same height as an upper surface of the wafer 30 being held in the recess portion of the wafer chuck 82b.

The reference mark 85 is provided on the wafer stage 82. The reference mark 85 is used when aligning the wafer stage 82 (loaded with the wafer 30) to the template 10.

The wafer stage 82 allows the wafer 30 to be placed thereon and moves in a plane (in a horizontal plane) parallel to the main surface of the wafer 30. The wafer stage 82 moves the wafer 30 to be below the template 10 when a pattern transfer process is performed.

The stage base 88 supports the template 10 with the template stage 81 and moves the template 10 in an up-and-down direction (a vertical direction) to press a pattern of the template 10 against a resist on the wafer 30. Inert gas, such as helium gas or carbon dioxide gas, can be ejected downward from a lower surface of the template stage 81 towards the wafer 30 or the like.

The imprint device 1 incorporates a mechanism that ejects inert gas and includes a supply pipe 71, a valve 72, a gas flow path 73, and a gas hole 74 as a gas supply unit.

An upstream end of the supply pipe 71 is connected to a gas supply source 70 such as a gas cylinder. The gas supply source 70 is filled with the inert gas. A downstream end of the supply pipe 71 is branched into a plurality of supply pipes 71e, 71w, 71n, and 71s, each of which is connected to the template stage 81.

The valve 72 is provided in the supply pipe 71 downstream of the gas supply source 70. Further, valves 72e, 72w are respectively provided for the supply pipes 71e, 71w, downstream of where the supply pipe 71 is branched. Valves are also supplied for the supply pipes 71n and 71s, but are not separately depicted.

The template stage 81 holds the template 10 in a recess portion provided on a lower surface thereof. The template stage 81 includes gas flow paths 73e, 73w to which downstream ends of the supply pipes 71e, 71w are respectively connected and which lead to a lower surface near outer edge portions of the template 10 having, for example a substantially rectangular shape. The template stage 81 similarly includes gas flow paths to which downstream ends of the supply pipes 71n, 71s are respectively connected. Gas holes 74e, 74w, 74n, and 74s to which the corresponding gas flow paths (73e, 73w, . . . ) are respectively connected are provided on the lower surface of the template stage 81 near the outer edge portions of the four sides of the template 10.

The lower surface of the template stage 81 is disposed at substantially the same height as a lower surface of the template 10 when held in the recess portion of the template stage 81. A pattern of the template 10 protrudes downward from the lower surface of the template 10.

With the configuration, the template stage 81 can selectively eject inert gas from the gas holes 74e, 74w, 74n, and 74s provided on the outer edge portions of the four sides of the template 10 while the template 10 is being held by the template stage 81.

The alignment unit 86 is provided over the stage base 88. The alignment unit 86 detects a position of the wafer 30 and a position of the template 10 based on alignment marks or the like provided on the wafer 30 and the template 10.

The alignment unit 86 includes a detection system 86a and an illumination system 86b. The illumination system 86b irradiates the wafer 30 and the template 10 with light. The detection system 86a detects images of alignment marks or the like provided on the wafer 30 and the template 10 by using the alignment scope 83 and aligns the wafer 30 and the template 10 based on the detection result. The detection system 86a may also detect whether or not a pattern of the template 10 has been filled with a resist by using the spread scope 84 when the template 10 is being pressed against a resist of the wafer 30.

The detection system 86a and the illumination system 86b respectively include mirrors 86x and 86y such as dichroic mirrors as image forming units. The mirrors 86x and 86y form images from the wafer 30 and the template 10 by using light from the illumination system 86b.

Specifically, light Lb from the illumination system 86b is reflected to a lower portion in which the template 10 and the wafer 30 are disposed by the mirror 86y. Light La from the wafer 30 and the template 10 is reflected to the detection system 86a side by the mirror 86x and proceeds to the spread scope 84. Light Lc from the wafer 30 and the template 10 passes through the mirrors 86x and 86y and proceeds to the alignment scope 83 in an upper portion.

The light source 89, serving as a curing unit, is a device that emits light such as ultraviolet light capable of curing a resist and is provided above the stage base 88. The light source 89 emits light from above the template 10 while the template 10 presses against the resist. In general, as long as the resist can be cured, light emitted by the light source 89 may be a light other than ultraviolet light, such as infrared light, visible light, or an electromagnetic wave more broadly.

The control unit 90 is an information processing device that performs various types of processing to control the imprint device 1. The control unit 90 includes, for example, a central processing unit (CPU), a read only memory (ROM), a random access memory (RAM), and the like, and includes a computer that performs predetermined arithmetic processing and control processing according to a program.

The control unit 90 controls the template stage 81, the wafer stage 82, the stage base 88, the light source 89, the valves 72, 72e, 72w, and the like, based on observation images acquired by the alignment scope 83, the spread scope 84, or the like. At this time, the control unit 90 refers to layout information acquired from the design device 2 and an inspection result acquired from the inspection device 3.

Method of Manufacturing Semiconductor Device

Next, a method of manufacturing a semiconductor device according to the first embodiment will be described with reference to FIG. 2 to FIGS. 14A to 14F. The method of manufacturing the semiconductor device according to the first embodiment includes an imprint process for the wafer 30.

Figure 2:
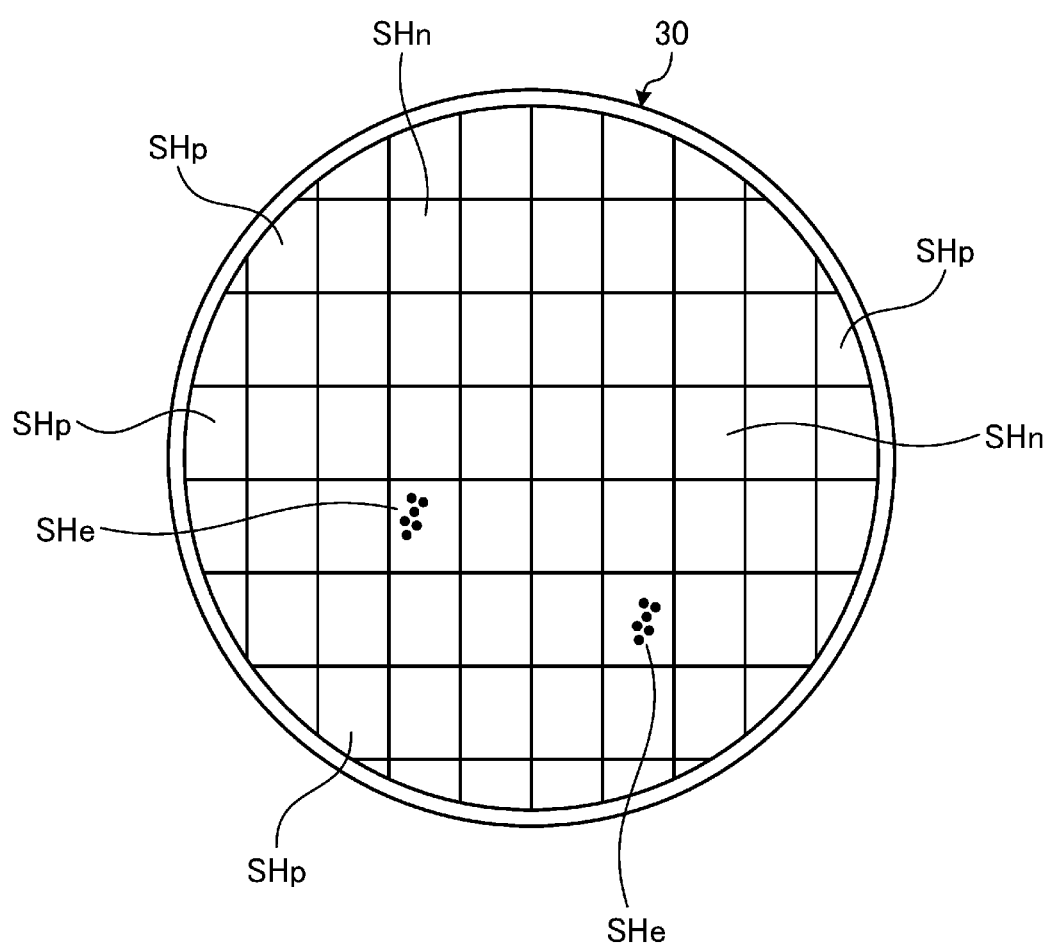
FIG. 2 depicts aspects of a method of manufacturing a semiconductor device according to the first embodiment.

FIG. 2 illustrates a plan view of the wafer 30 that is a target of an imprint process according to the first embodiment. The wafer 30 is a target of the imprint process. That is, the wafer 30 is a substrate on which patterns are to be formed in the imprint process.

As illustrated in FIG. 2, the wafer 30 includes a plurality of shots SH (SHn, SHp, and SHe) (shot regions) formed through a plurality of manufacturing processes. The individual shots SH correspond to unit sizes for certain individual processes in a manufacturing process of a semiconductor device, particularly imprinting or photolithographic patterning related processes.

Among the plurality of shots SH formed on the wafer 30, the shot SHn is a shot region in a region other than a peripheral portion of the wafer 30. The shot SHn includes all of predetermined configurations that the shots SH have in design and has a predetermined area having, for example, a rectangular shape. The shots SHn may be referred to as "a full shot region" or the like in some contexts. The wafer 30 undergoes a plurality of manufacturing processes to be performed thereafter, and thereby, one or more semiconductor devices can be obtained from each shot SHn. That is, each shot SHn may have a single chip die or a plurality of chip dies therein.

Among the plurality of shots SH formed on the wafer 30, the shot SHp is a partial shot region formed on the peripheral portion of the wafer 30 (outer edge region of the wafer 30). A part of the shot SH is formed on the wafer 30 but a part of the predetermined full shot SH area is missing (that is, it is outside the wafer edge or the like).

That is, the shot SHp has less than the full area of the intended shot SH pattern. Depending on device design, shape, occupied area, and the like in the shot SHp, one or more semiconductor devices (chip dies) might still be obtained from a shot SHp or it might be the case that no semiconductor device can be obtained from any shot SHp.

Among the plurality of shots SH formed on the wafer 30, the shot SHe is a shot SH having some defects already generated in the manufacturing processes so far. The defects that may be generated in the manufacturing process include, for example, a case where the number of particles, a contamination level, or the like exceed a predetermined range, or a case where a configuration to be obtained in a predetermined manufacturing process deviates from a specified standard.

The defects are determined based on results of inspection performed by various inspection devices after passing through predetermined stages of the manufacturing process. Generally, the number of shots SHe on one wafer tends to increase as the number of manufacturing processes increases.

It is noted that, in the example of FIG. 2, two of the shots SH have been determined as defective shots SHe. It is noted that, regardless of the example depicted in FIG. 2, a shot SHp may also be considered to be or separately identified as defective.

Figure 3A:
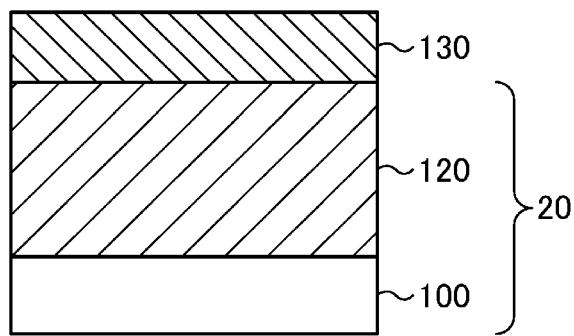
FIGS. 3A to 3C depict aspects of a method of manufacturing a semiconductor device according to the first embodiment.
Figure 3B:
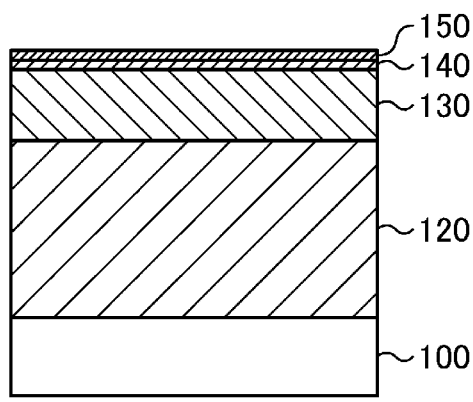
Figure 3C:
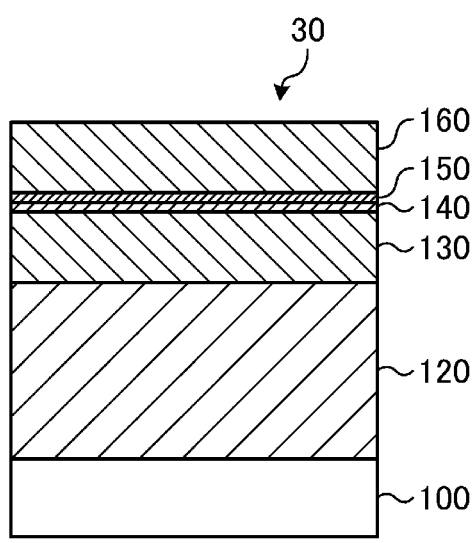

Next, an example of a process in which a plurality of films are formed on the wafer 30 in a manufacturing process of the semiconductor device according to the first embodiment is illustrated in cross-sectional views of FIGS. 3A to 3C. FIGS. 3A to 3C also illustrate cross-sectional views of the wafer 30 including the shots SH.

In the processes of FIGS. 3A to 3C, a plurality of films including the resist film 160 (which is to be imprinted in an imprint process) are formed on the wafer 30. However, in a film forming process on the wafer 30, it is general the case that individual films are formed over the entire wafer 30 instead of individually or separately for each shot SH. The film forming process is performed by, for example, a thermal oxidation device, a coating device, and the like.

As illustrated in FIG. 3A, the wafer 30 includes a silicon substrate 100 and a process target film 120 formed on the silicon substrate 100. The process target film 120 is a film to be processed which uses a stack mask structure, and is, for example, a single-layer film such as a silicon oxide film or a silicon nitride film, or a stack film in which a plurality of films are stacked.

A spin on carbon (SOC) film 130 is formed on the process target film 120. The SOC film 130 is formed by, for example, a spin coating method and is an organic film.

As illustrated in FIG. 3B, a spin on glass (SOG) film 140 is formed on the SOC film 130. The SOG film 140 is formed by, for example, a spin coating method and is an inorganic film such as a silicon oxide film.

An adhesive film 150 is formed on the SOG film 140. The adhesive film 150 is an organic film to which, for example, a surfactant including fluorine atoms or silicon atoms, a silane coupling agent, or the like is added. The adhesive film 150 enhances adhesion between a resist film 160 to be formed thereafter and the SOG film 140 thereunder.

As illustrated in FIG. 3C, the resist film 160 is formed on the adhesive film 150. A so-called photoresist material, a silicon-containing resist material, or the like can be used as the resist film 160, and the resist film 160 is an example of a photocurable resin formed by, for example, a spin coating method. The resist film 160 illustrated in FIG. 3C is a target film of the imprint process and at this point in the process is a liquid (or a flowable/moldable resin) until the imprint process is completed.

It is noted that a stack structure configured with the SOC film 130, the SOG film 140, the adhesive film 150, and the resist film 160 which are formed on the process target film 120 is also referred to as, for example, a stack mask structure. Each film in the stack mask structure has different etching resistance against different etching gas. By sequentially patterning respective films while using characteristic differences between the films, the process target film 120 can be processed while maintaining a mask structure of a thick film.

Figure 5:
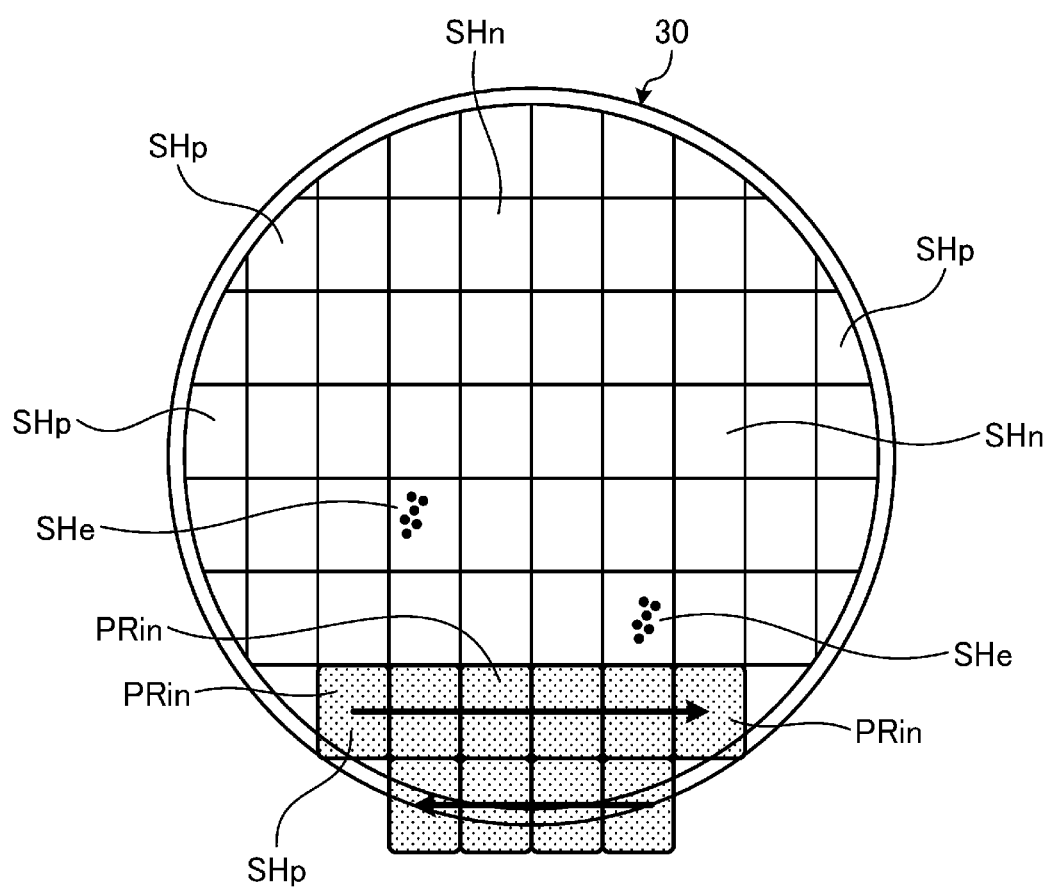
FIG. 5 depicts aspects of a method of manufacturing a semiconductor device according to the first embodiment.

Next, an example of an imprint process by the imprint device 1 according to the first embodiment is illustrated in plan views of FIGS. 4 and 5. The imprint process by the imprint device 1 is sequentially performed for each of a plurality of shots SH provided in the wafer 30. That is, one shot SH is imprinted each time the template 10 is pressed against the wafer 30 (or more particularly the resist 160 thereon).

As described above, the control unit 90 of the imprint device 1 acquires layout information on the wafer 30 from the design device 2. The layout information includes information about a non-target shot region that is not to be a target of the imprint process among the shots SHp. A non-target shot is a shot SHp with an area that is less than a predetermined ratio of a normal shot SHn.

That is, among the shots SHp, no semiconductor device can be acquired from shots SHp having an area smaller than some predetermined area, and thus, there is no point in performing the imprint process on such shots SHp. Furthermore, when the area of the shots SHp is too small, it is difficult to stably press the template 10 against the wafer 30 to perform the imprint process. Therefore, some shots SHp may be non-targets in the imprint process.

Further, the control unit 90 of the imprint device 1 acquires an inspection result of the wafer 30 from the inspection device 3. The inspection result includes information on a non-target shot among the plurality of shots SH of the wafer 30 that is no longer a target of the imprint process due to a defect determination by the inspection device 3.

For example, when a defect in a shot SH is caused by particles or foreign matter, an imprint process on such a shot SH would be likely to cause the particles or the foreign matter to adhere to the template 10 and contaminate the template 10 for subsequent imprints, or the template 10 and the wafer 30 may even be damaged due to so-called, "dust garbage biting" or the like between the template 10 and the wafer 30. Therefore, all or some shots SHe already determined to be defective are set as non-targets of the imprint process.

It is noted that a plurality of inspection devices may be connected to the control unit 90 of the imprint device 1, and the non-target shots determined to be defective may be information obtained by cumulative results of information provided from the plurality of inspection devices. In the example of FIG. 4, two shots SHe determined to be defective as illustrated in FIG. 2 and are designated as non-target shots.

As such, the non-target shots may include the shots SHp having an area less than a predetermined area and the shots SHe determined to be defective before the imprint process.

The control unit 90 determines the shots SH other than the non-target shots as target shots of the imprint process, based on information on the non-target shot and layout information acquired from the design device 2. The target shots are the shots SHp having an area larger than a predetermined area and the shots SHn other than the shots SHe.

The control unit 90 may acquire information of a target shot from the design device 2 and the inspection device 3 together with information of a non-target shot or instead of the information of the non-target shot. When the information of the target shot is acquired instead of the information of the non-target shot, the control unit 90 determines shots other than the shot designated as a target shot as non-target shots.

In the imprint device 1, a process sequence is predetermined in which an imprint process for a plurality of shots SH provided on the wafer 30 is performed. The process sequence of the plurality of shots SH is determined such that an efficient process can be performed, for example, an imprint process is sequentially performed for the shots SH adjacent to each other.

For example, a step-and-repeat method may be used as the process sequence of the plurality of shots SH. In the step-and-repeat method, such as illustrated in FIGS. 4 and 5, shots SH adjacent to each other in the same horizontal row are processed in order along the same direction (left or right) while shots in adjacent rows are processed in order along the reversed (opposite) direction (right or left).

In more detail, an imprint process is sequentially performed along a leftward direction or a rightward direction for the shots SH in each row, and each time the process for one row ends, the imprint process is performed in the opposite direction for the rows adjacent to each other in the vertical direction of the drawing sheet.

As such, by starting the process from a lower end or an upper end of the wafer 30 and ending the process at an opposite end portion, the imprint process can be efficiently performed for the plurality of shots SH.

In other examples, the imprint process may be sequentially performed on shots SH in columns along an upward page direction or a downward page direction with the processing direction for adjacent columns being reversed for each column (vertical row).

As such, by starting the process from the right end or the left end of the wafer 30 and ending the process in an opposite end portion, the imprint process can be efficiently performed for the plurality of shots SH.

The imprint process using a step-and-repeat method will be described in more detail with reference to FIGS. 4 and 5.

As illustrated in FIG. 4, the control unit 90 of the imprint device 1 moves the wafer stage 82 on which the wafer 30 is placed and sequentially performs a process for the shots SH in a first row at the lower end (edge) portion of the wafer 30. In the example of FIG. 4, the process proceeds from the shot SH at the right end to the shot SH at the left end, but, in other examples, the process may begin at the left end and go towards the right end.

The six shots SH at the lower end portion of the wafer 30 are all shots SHp that are partially missing (incomplete shot regions). Furthermore, it is assumed in this example that, among these six shots SHp, the shots at the two ends of the row are non-target shots that have a predetermined area or less, and the four shots in the center of the row are target shots satisfying the predetermined area.

The control unit 90 skips the non-target shots at both ends of the row and performs a transfer process PRin for the four target shots in the center of the row. Additional details of the transfer process PRin will be described below.

As illustrated in FIG. 5, when the process for the shots SH at the lower end portion of the wafer 30 ends, the control unit 90 performs a process for the shots SH adjacent to each other in a row adjacent in an upward direction from the shots SH at the lower end portion of the wafer 30. As in the example of FIG. 4, when the shots SH of the lower end portion of the wafer 30 are processed from the right end toward the left end, the shots SH in the second row (the adjacent row) are processed from the left end toward the right end.

It is also assumed that, among eight shots SH in the second row, the two shots at the ends of row are non-target shots and just the six shots in the center are target shots.

The control unit 90 skips the non-target shots at both ends of the row and performs the transfer process PRin for the six target shots in the center. Details of the transfer process PRin are illustrated in the cross-sectional views of FIGS. 6A to 6D and FIGS. 7A to 7D.

The transfer process PRin is a process of pressing the template 10 against the resist film 160, curing resist film 160 by irradiating the resist film with ultraviolet light through the template 10, releasing the template 10 from the resist film 160 while supplying helium gas or the like from the template stage 81 on the outer edge portion side of the template 10, and thus transferring the pattern 10p of the template 10 to the resist film 160.

FIGS. 6A to 6D illustrate states for the transfer process PRin performed for any shot SH at a lower end portion of the wafer 30.

Figure 6A:
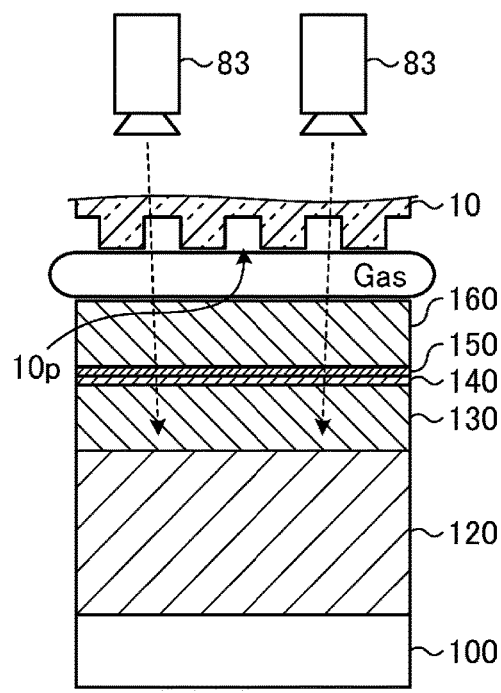
FIGS. 6A to 6D depict aspects of a method of manufacturing a semiconductor device according to the first embodiment.

As illustrated in FIG. 6A, the control unit 90 of the imprint device 1 moves the wafer stage 82 from, for example, the right side of the drawing sheet and locates a predetermined shot SH of the wafer 30 below the template 10. Thereby, the predetermined shot SH of the wafer 30 faces a pattern 10p of the template 10. At this time, a space between the shot SH and the template 10 is a high-concentration atmosphere of inert gas such as helium gas or carbon dioxide gas.

Further, the control unit 90 observes an alignment mark provided on the template 10 and an alignment mark formed on the wafer 30, from above the template 10 and the wafer 30 by using the alignment scope 83.

Further, the control unit 90 moves the wafer stage 82 such that the alignment marks of the template 10 and the wafer 30 overlap each other in an up-and-down direction by reference to the observation images. Thereby, the shot SH which is an imprint process target, and the pattern 10p of the template 10 are roughly aligned.

The rough alignment is an operation of roughly (grossly) aligning positions of the shot SH of the wafer 30 and the pattern 10p of the template 10 before the template 10 presses against the resist film 160 of the wafer 30.

Figure 6B:
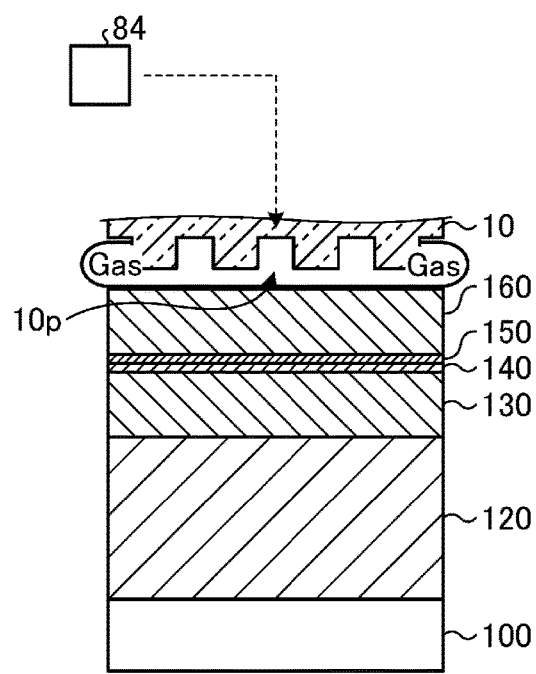

As illustrated in FIG. 6B, the control unit 90 drops the template 10 from above the wafer 30 while observing the template 10 and the wafer 30 by using the spread scope 84.

Thereby, the template 10 presses against the resist film 160 on the wafer 30. At this time, in order to prevent physical, direct contact between the wafer 30 and the template 10, the drop position of the template 10 is adjusted to place a projection portion of the pattern 10p slightly above a bottom surface of the resist film 160.

When the template 10 comes into contact with the resist film 160, the control unit 90 performs a fine alignment of the template 10 and the wafer 30 with reference to an image observed by the spread scope 84. A fine alignment is an operation of precisely aligning the position of the shot SH of the wafer 30 to the position of the pattern 10p of the template 10 while the template 10 is in contact with the resist film 160.

When the template 10 is pressed against the resist film 160 30, the resist film 160 fills into a recess portion of the pattern 10p so as to follow an uneven portion of the pattern 10p of the template 10.

The control unit 90 performs the fine alignment with reference to the observation image from the spread scope 84, and in some cases, the control unit 90 maintains the state where the template 10 is pressed against the resist film 160 until the recess portion of the pattern 10p of the template 10 is substantially filled with the resist film 160 even after the fine alignment ends.

At this time, a high-concentration atmosphere of inert gas is formed around the resist film 160 and the template 10. Therefore, gas such as air can be prevented from being trapped between the resist film 160 and the template 10, and bubbles can be prevented from being taken into the resist film 160.

If inert gas is to be supplied around the resist film 160 and the template 10, helium gas has a very small atomic size and easily dissipates from the resist film 160 and/or dissolves in the resist film 160. Carbon dioxide gas also easily dissolves in the resist film 160. Thus, helium gas, carbon dioxide gas, or the like will generally not remain for long as bubbles in the resist film 160.

Figure 6C:
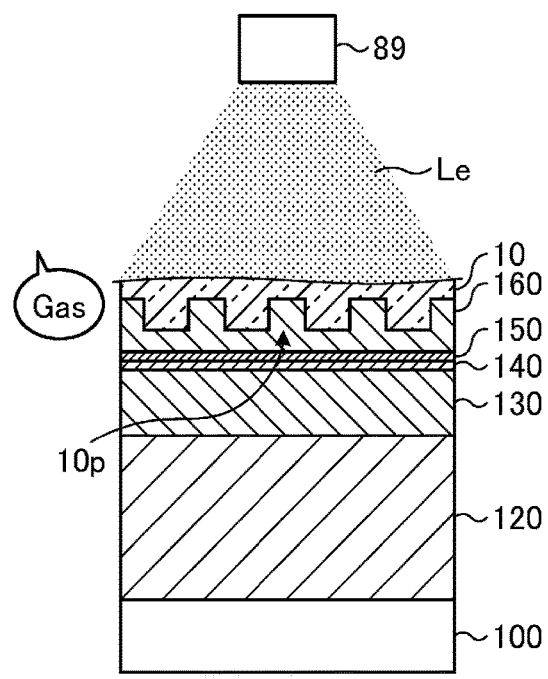

As illustrated in FIG. 6C, once the resist film 160 is filled in the recess portion of the pattern 10p of the template 10, the light source 89 emits ultraviolet light Le from above the template 10 and the wafer 30 while the template 10 is pressed against the resist film 160.

The ultraviolet light Le preferably has any wavelength of, for example, 10 nm or more and 400 nm or less. As long as the resist film 160 can be cured, light which is emitted may be light other than the ultraviolet light such as infrared light, visible light, or an electromagnetic wave.

The ultraviolet light Le passes through the transparent template 10 to irradiate the resist film 160. Thereby, the resist film 160, which is, for example, a photocurable resin, is cured to transfer the pattern 10p of the template 10 to the resist film 160.

The control unit 90 supplies inert gas such as helium gas toward a lower side from the shot SH side which is on a lower surface of the template stage 81 and for which an imprint process is to be performed next, in a state where the template 10 is being pressed against the cured resist film 160.

In the example of FIG. 6C, the shot SH for which the imprint process is performed next is on the left side of the drawing. The control unit 90 opens the valves 72 and 72e (illustrated in FIG. 1A) and ejects inert gas from the gas holes 74e among the four gas holes 74e, 74w, 74n, and 74s on the lower surface of the template stage 81.

Figure 6D:
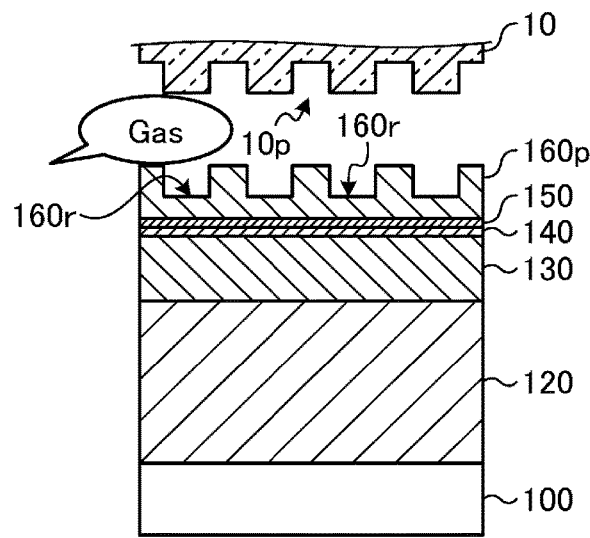

As illustrated in FIG. 6D, when the template 10 is raised, the template 10 is released from the patterned resist 160p. Thereby, the patterned resist 160p is formed on a target shot.

The patterned resist 160p has a pattern in which the pattern 10p of the template 10 is reversed. Further, a residual resist film 160r is formed in a recess portion between projection patterns of the patterned resist 160p. This is because, when the template 10 is pressed, the projection portions of the pattern 10p of the template 10 are maintained slightly above a bottom surface of the resist film 160.

Further, inert gas from the gas hole 74e is continuously supplied even after the template 10 is separated from the patterned resist 160p. Therefore, by an operation of raising the template 10, a part of the inert gas being supplied downward from the shot SH side from where the imprint process is to be performed next is pulled in between the patterned resist 160p and the template 10.

Furthermore, when the template 10 is moved to the left to be above the shot SH to be imprinted next, air between the next shot SH and the template 10 is replaced with inert gas (such as helium gas or carbon dioxide gas) and is in a high-concentration atmosphere of the inert gas.

FIGS. 7A to 7D illustrate states where the transfer process PRin is performed for any shot SH in the second row above the lower end portion of the wafer 30.

Figure 7A:
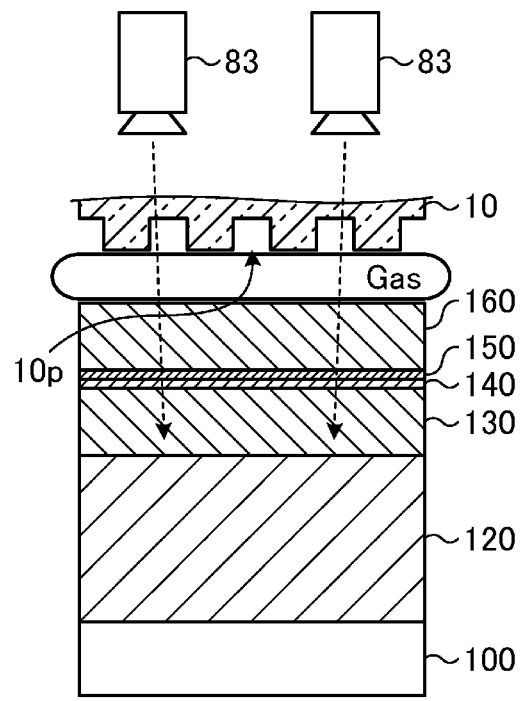
FIGS. 7A to 7D depict aspects of a method of manufacturing a semiconductor device according to the first embodiment.

As illustrated in FIG. 7A, the control unit 90 moves the wafer stage 82 from, for example, the left side of the drawing and locates a predetermined shot SH of the wafer 30 below the template 10. At this time, a space between the shot SH and the template 10 is in a high-concentration atmosphere of inert gas such as helium gas. The inert gas is supplied during an imprint process for the shot SH immediately before the shot SH, and air between the shot SH and the template 10 is thus replaced.

The control unit 90 roughly aligns the shot SH of the wafer 30 with pattern 10p of the template 10 based on an image observed by the alignment scope 83.

Figure 7C:
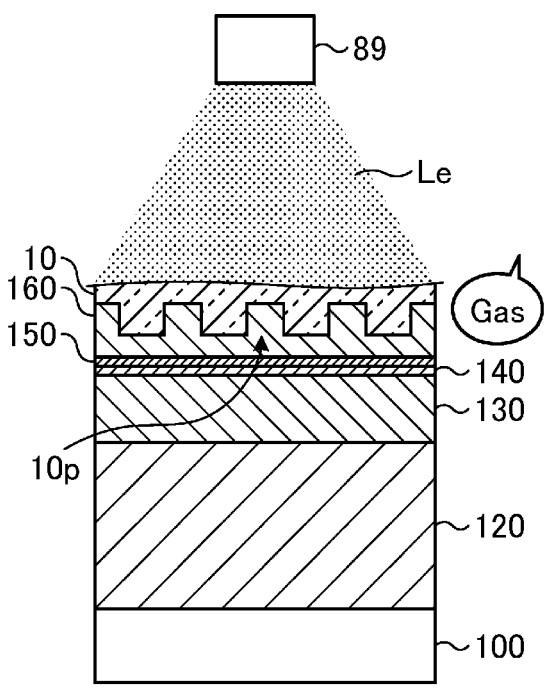
Figure 7B:
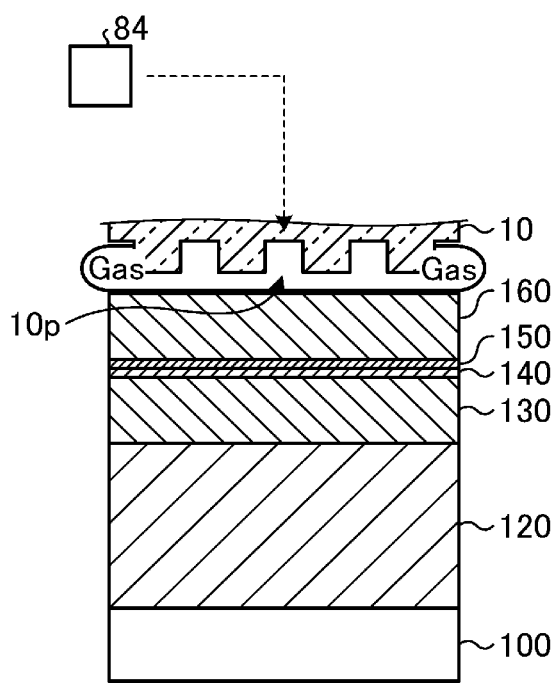

As illustrated in FIG. 7B, the control unit 90 drops the template 10 and brings the template 10 into contact with the resist film 160 on the wafer 30, and in this state, finely aligns the shot SH of the wafer 30 with the pattern 10p of the template 10 based on an image observed by the spread scope 84.

During this time, the resist film 160 fills into the recess portion of the pattern 10p of the template 10. Also at this time, bubbles of air or the like can be prevented from being taken into the resist film 160 by use of a high-concentration atmosphere of inert gas such as helium gas.

As illustrated in FIG. 7C, when the resist film 160 is filled into the recess portion of the pattern 10p of the template 10, the light source 89 emits ultraviolet light Le, and thereby the resist film 160 is cured.

Further, the control unit 90 supplies inert gas such as helium gas toward a lower side from the shot SH side which is on a lower surface of the template stage 81 and for which an imprint process is to be performed next.

In the example of FIG. 7C, the shot SH for which the imprint process is to be performed next is on the right side of the drawing. The control unit 90 opens the valves 72 and 72w illustrated in FIG. 1A and ejects inert gas from the gas holes 74w among the four gas holes 74e, 74w, 74n, and 74s on a lower surface of the template stage 81.

Figure 7D:
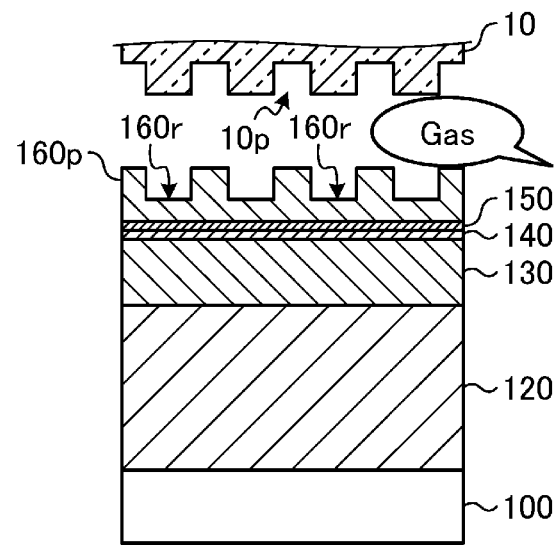

As illustrated in FIG. 7D, when the template 10 is raised, the template 10 is released from the patterned resist 160p. During the release process, the supply of inert gas from the gas hole 74w is continued. Thereby, for the imprint process performed next, and when the template 10 moves above the shot SH on the right side of the drawing, a space between this next shot SH and the template 10 is in a high-concentration atmosphere of inert gas.

Figure 9:
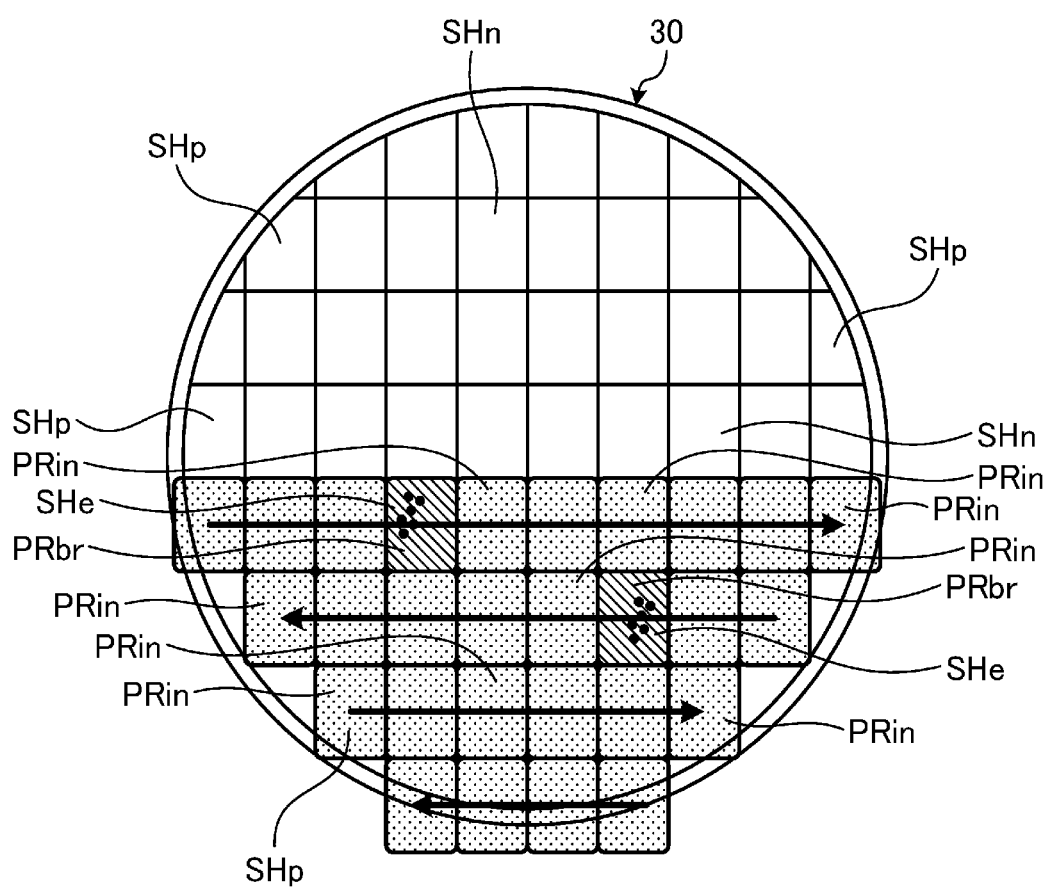
FIG. 9 depicts aspects of a method of manufacturing a semiconductor device according to the first embodiment.

Next, examples of an imprint process following the processes of FIGS. 4 and 5 are illustrated in the plan views of FIGS. 8 and 9.

When the process for the shots SH in the second row from the lower end portion of the wafer 30 ends, the control unit 90 executes the process of the shot SH in a third row adjacent in upward direction of the drawing. In the example of FIG. 5, the process of the shots SH in the second row was performed from the left to the right, and thus, a process of the shots SH in the third row is performed from the right to the left.

As illustrated in FIG. 8, a fourth shot SH from the right end of the third row is a shot SHe which has been determined to be defective and is thus a non-target shot for which the imprint process is not performed. The control unit 90 skips the shot SHp at a right end, performs the transfer process PRin for the following two shots SHe, and then performs a non-transfer process PRbr for the fourth shot SH from the right end instead of the transfer process PRin. Details of the non-transfer process PRbr will be described below.

As illustrated in FIG. 9, when the process for the shots SH in the third row from a lower end portion of the wafer 30 ends, the control unit 90 performs a process for the shots SH in the fourth row adjacent in an upward direction.

That is, the control unit 90 sequentially performs the transfer process PRin for the shots SH from the left end in the opposite direction to the third row. The control unit 90 performs the non-transfer process PRbr for the fourth shot SHe from the left end. Details of the non-transfer process PRbr are illustrated in the cross-sectional views of FIGS. 10A to 10D and FIGS. 11A to 11D.

The non-transfer process PRbr is a process of separating the template 10 from the resist film 160 while supplying helium gas or the like from the template stage 81 on an outer edge portion side of the template 10 after the template 10 approaches the resist film 160 but does not come into contact with the resist film 160.

FIGS. 10A to 10D illustrate states where the non-transfer process PRbr is performed for the shot SHe in the third row from a lower end portion of the wafer 30.

Figure 10A:
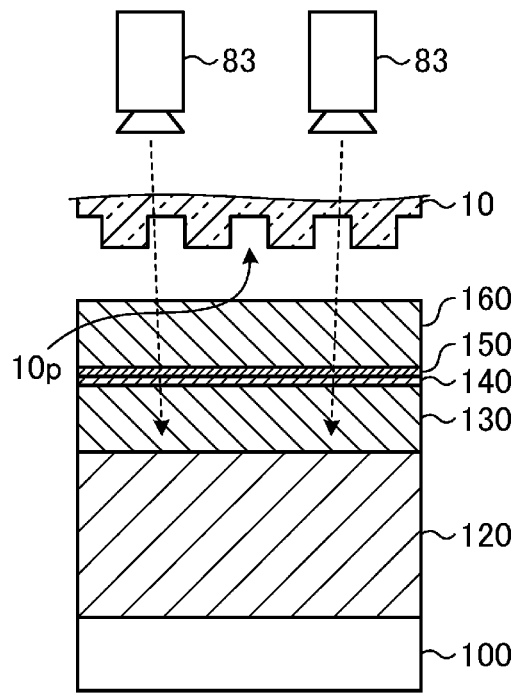
FIGS. 10A to 10D depict aspects of a method of manufacturing a semiconductor device according to the first embodiment.

As illustrated in FIG. 10A, the control unit 90 moves the wafer stage 82 from the right side of the drawing and locates the shot SHe in the third row from a lower end portion of the wafer 30 below the template 10.

Also at this time, the control unit 90 may roughly align the shot SH of the wafer 30 with the pattern 10p of the template 10 based on an image observed by the alignment scope 83.

However, the non-transfer process PRbr does not require high-precision alignment such as in the transfer process PRin.

Also at this time, inert gas supplied in the imprint process for the immediately preceding shot SH may be present between the shot SH and the template 10.

Figure 10C:
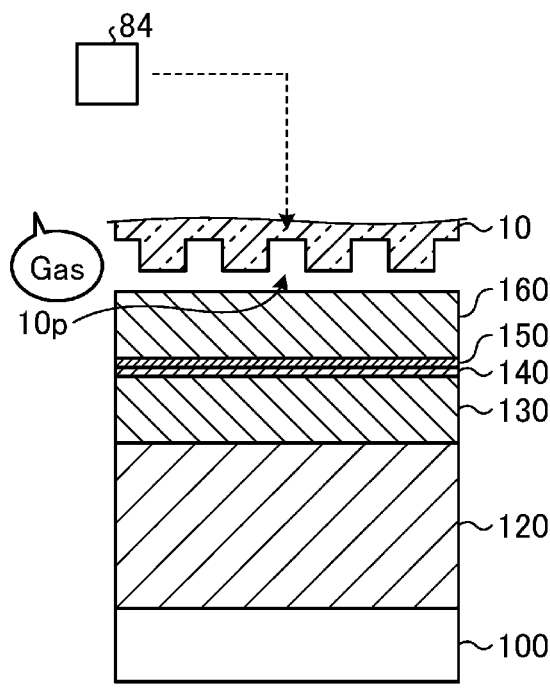
Figure 10B:
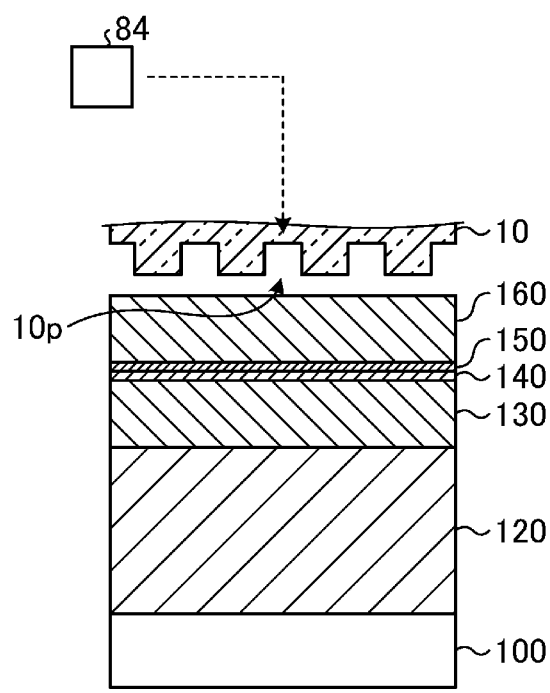

As illustrated in FIG. 10B, the control unit 90 drops the template 10 and brings the template 10 close to the resist film 160 on the wafer 30. At this time, a distance that the template 10 drops is greater than half of a drop distance of the template 10, for example, during the transfer process PRin and less than the drop distance of the template 10 during the transfer process PRin. Preferably, the drop distance of the template 10 is controlled such that a distance between the template 10 and the resist film 160 is as small as possible while still avoiding contact with the resist film 160. The control unit 90 may control a drop position of the template 10 based on an image observed by the spread scope 84.

As illustrated in FIG. 10C, the control unit 90 supplies inert gas toward a lower portion from the shot SH side which is on a lower surface of the template stage 81 and for which an imprint process is to be performed next, in a state where the template 10 is close to but not contacting the resist film 160.

In the example of FIG. 10C, the shot SH for which the imprint process is to be performed next is on the left side of the drawing. The control unit 90 opens the valves 72 and 72e illustrated in FIG. 1A and ejects inert gas from the gas holes 74e among the four gas holes 74e, 74w, 74n, and 74s on the lower surface of the template stage 81.

Figure 10D:
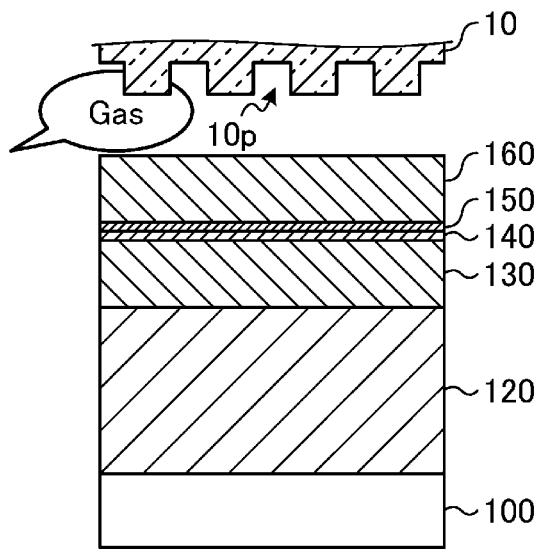

As illustrated in FIG. 10D, the control unit 90 raises the template 10 while continuously supplying inert gas from the gas hole 74e. Thereby, when the imprint process is performed next, and the template 10 moves above the shot SH on the left side of the drawing, a space between the next shot SH and the template 10 is in a high-concentration atmosphere of inert gas.

It is noted that a speed at which the template 10 is pulled up may be variously adjusted based on a release speed of the template 10 at the time of, for example, the transfer process PRin. That is, a raising speed of the template 10 in the non-transfer process PRbr may be equal to, faster than, or slower than a release speed of the template 10 in the transfer process PRin.

FIGS. 11A to 11D illustrate states where the non-transfer process PRbr is performed for the shot SHe in the fourth row from the lower end portion of the wafer 30.

Figure 11A:
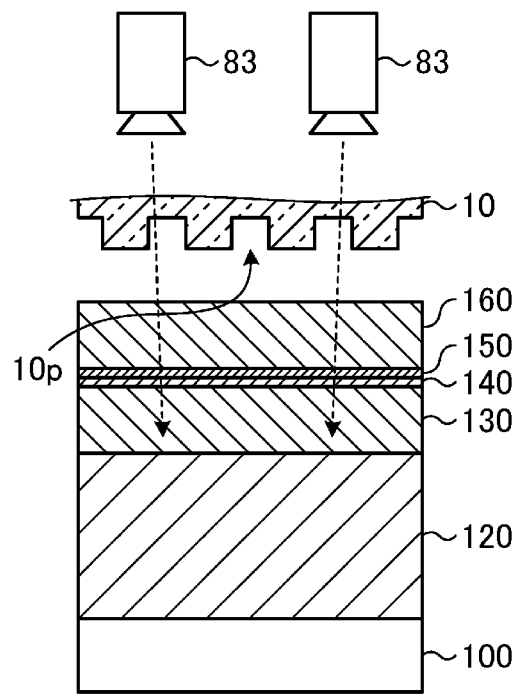
FIGS. 11A to 11D depict aspects of a method of manufacturing a semiconductor device according to the first embodiment.

As illustrated in FIG. 11A, the control unit 90 moves the wafer stage 82 from the left side of the drawing and locates the shot SHe in the fourth row from the lower end portion of the wafer 30 below the template 10.

Figure 11B:
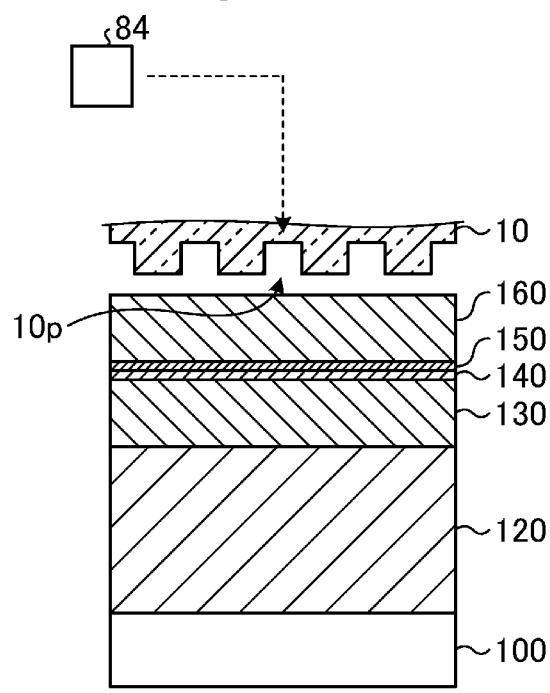

As illustrated in FIG. 11B, the control unit 90 drops the template 10 by a drop distance greater than half of a drop distance of the template 10 but less than a drop distance of the template 10 in the transfer process PRin and brings the template 10 close to the resist film 160 on the wafer 30 such that a distance between the template 10 and the resist film 160 is preferably as small as possible while still avoiding contact with the resist film 160.

Figure 11C:
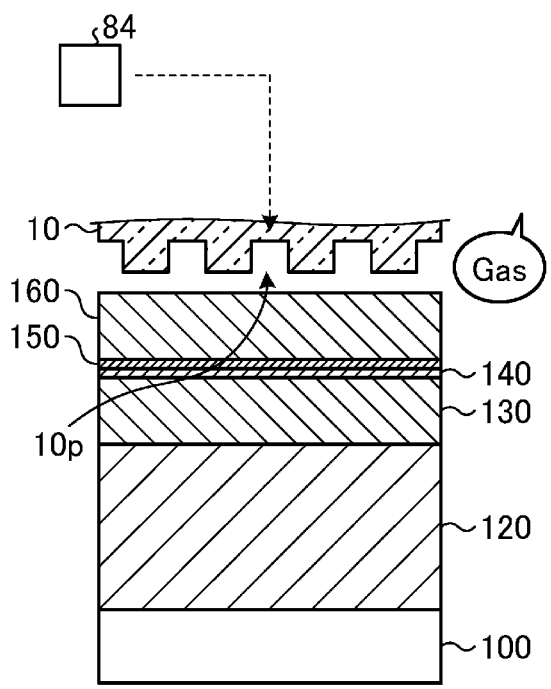

As illustrated in FIG. 11C, the control unit 90 supplies inert gas toward a lower portion from the shot SH side which is on a lower surface of the template stage 81 and for which an imprint process is to be performed next, in a state where the template 10 is close to the resist film 160.

In the example of FIG. 11C, the shot SH for which the imprint process is to be performed next is on the right side of the drawing. The control unit 90 opens the valves 72 and 72w illustrated in FIG. 1A and ejects inert gas from the gas holes 74w among the four gas holes 74e, 74w, 74n, and 74s on a lower surface of the template stage 81.

Figure 11D:
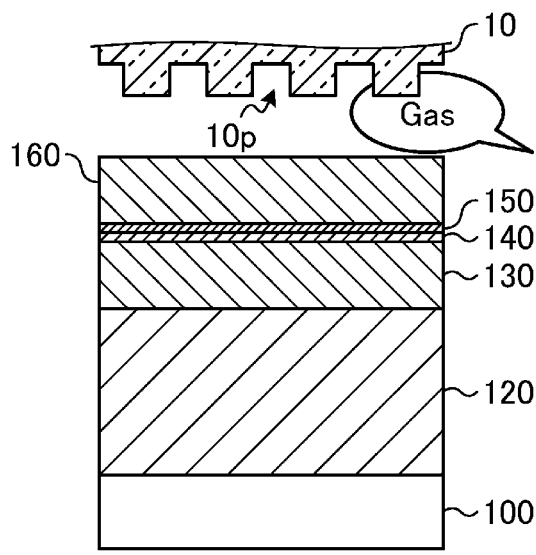

As illustrated in FIG. 11D, the control unit 90 raises the template 10 while continuously supplying inert gas from the gas hole 74w. Thereby, when the imprint process is performed next, and the template 10 moves above the shot SH on the right side of the drawing, a space between the next shot SH and the template 10 is in a high-concentration atmosphere of inert gas.

It is noted that, in the example of FIG. 11D, a raising speed of the template 10 in the non-transfer process PRbr may be appropriately adjusted to be equal to, faster than, or slower than a release speed of the template 10 in the transfer process PRin.

Figure 12:
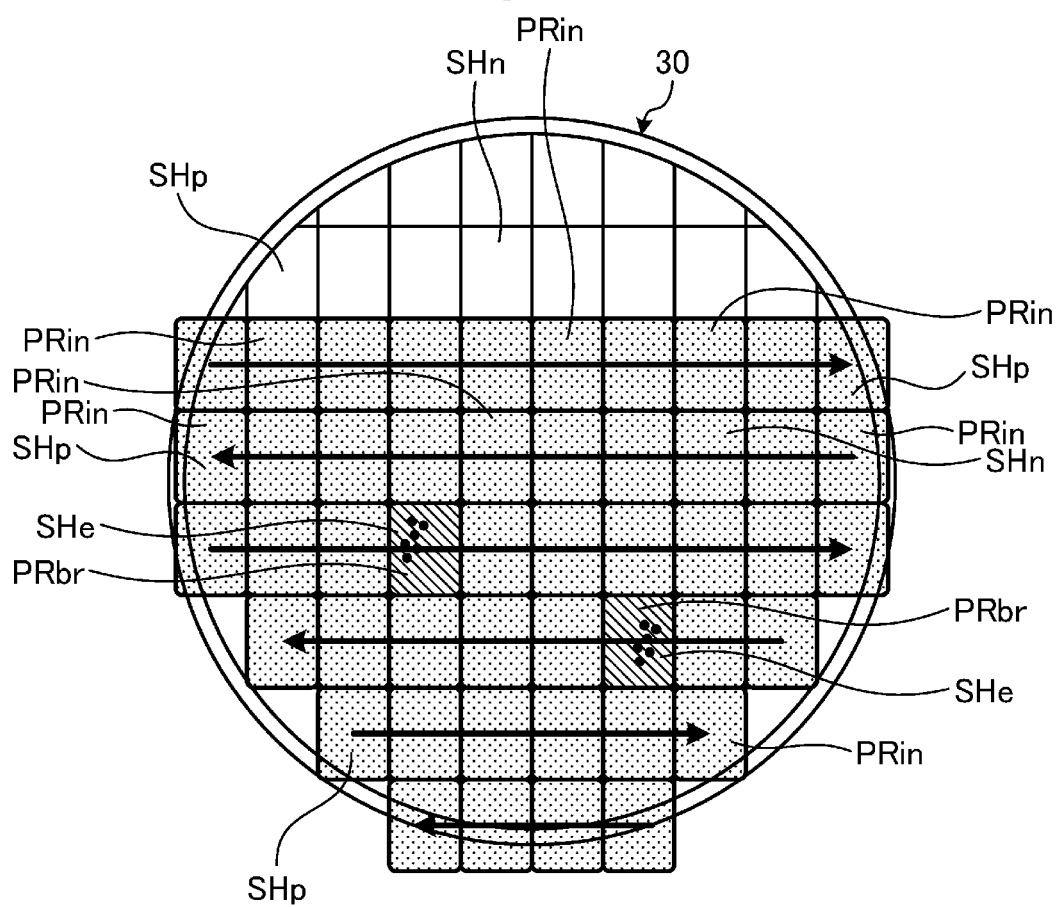
FIG. 12 depicts aspects of a method of manufacturing a semiconductor device according to the first embodiment.

As illustrated in a plan view of FIG. 12, when the process for the shots SH in the fourth row from the lower end portion of the wafer 30 ends, the control unit 90 next performs a process for the shots SH in a fifth row and the shots SH in a sixth row adjacent to each other in an upward direction.

The control unit 90 performs the transfer process PRin for the shots SH in the fifth row from a right end to a left end, that is, in a direction opposite to the fourth row. The control unit 90 performs the transfer process PRin for the shots SH in the sixth row from the left end to the right end, that is, in a direction opposite to the fifth row.

Figure 13:
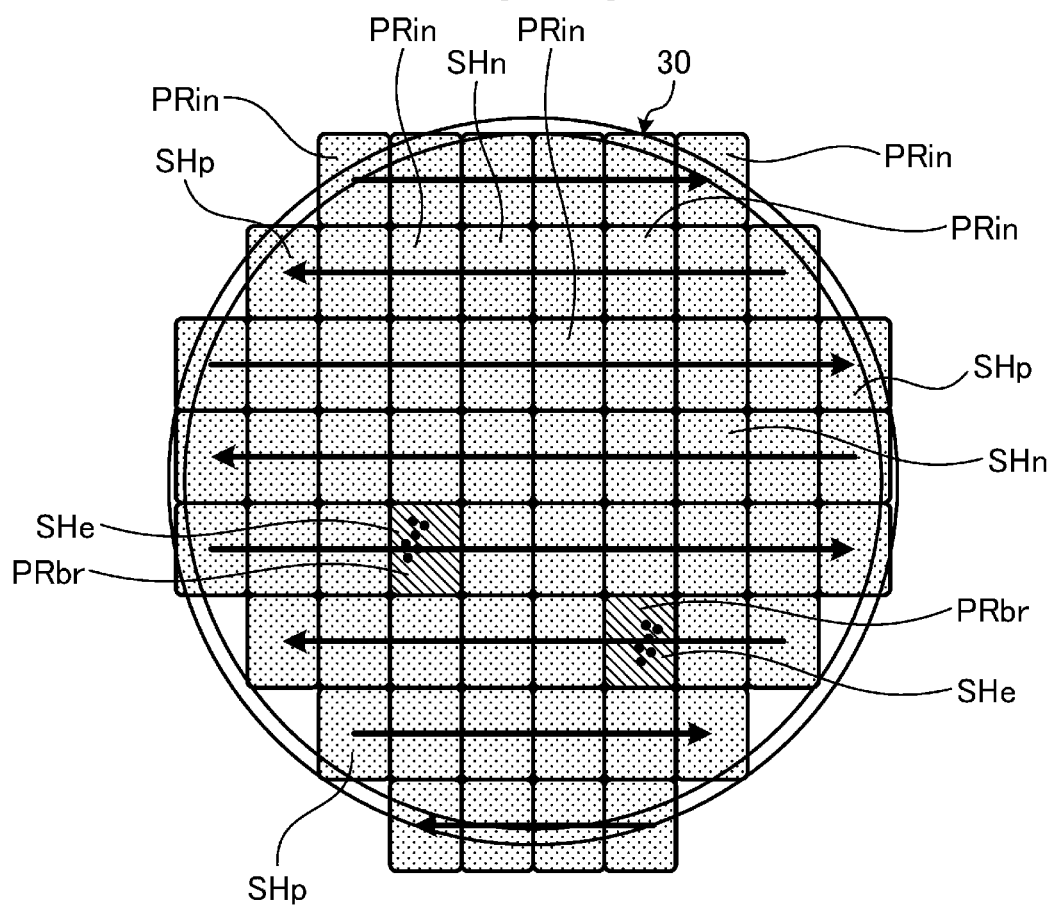
FIG. 13 depicts aspects of a method of manufacturing a semiconductor device according to the first embodiment.

As illustrated in FIG. 13, the control unit 90 skips the shot SHp at the right end of the second row from the upper end portion of the wafer 30, performs the transfer process PRin for a plurality of target shots SH in the center of the row in sequence, and also skips the shot SHp at the left end of the row.

The control unit 90 skips the shot SHp at the left end of an upper end (edge) portion of the wafer 30, performs the transfer process PRin for the plurality of shots SH in the center of the upper end portion, and also skips the shot SHp at the right end of the upper end portion.

In this way, the transfer process PRin for all those shots SH which are targets of an imprint process ends. Furthermore, the non-transfer process PRbr for the shot (s) She among non-target shots of the wafer 30 determined to be defective ends. In addition, all processes for the shots SHp which are a missing (partial) shot having an area less than a predetermined area are skipped.

Thereby, the imprint process according to the first embodiment for the wafer 30 ends.

Thereafter, the resist film 160 in the non-target shots, such as the shots SHp for which the imprint process was skipped and the shots SHe for which the non-transfer process PRbr was performed, is irradiated with ultraviolet light and cured. A curing process of the resist film 160 for the non-target shots is performed by, for example, an exposure device or the like. An entire surface of the wafer 30 including the non-target shots may be irradiated with ultraviolet light to collectively cure the resist film 160 for the plurality of non-target shots at the same time.

Through a process illustrated in cross-sectional views of FIGS. 14A to 14F, the process target film 120 is processed by using a stack mask structure including the patterned resist 160p, and the pattern of the patterned resist 160p is transferred to the process target film 120.

Figure 14A:
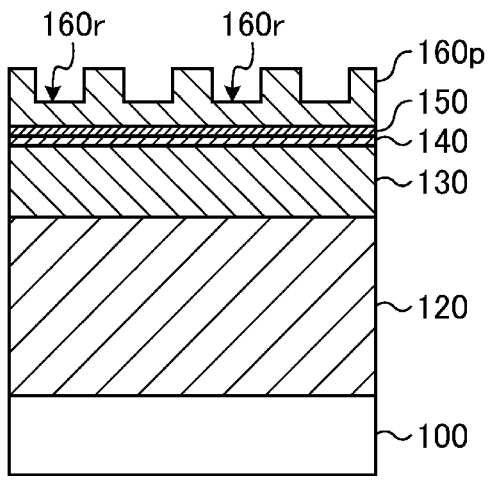
FIGS. 14A to 14F depict aspects of a method of manufacturing a semiconductor device according to the first embodiment.

As illustrated in FIG. 14A, the patterned resist 160p formed by an imprint process includes the residual resist film 160r between projection patterns.

Figure 14D:
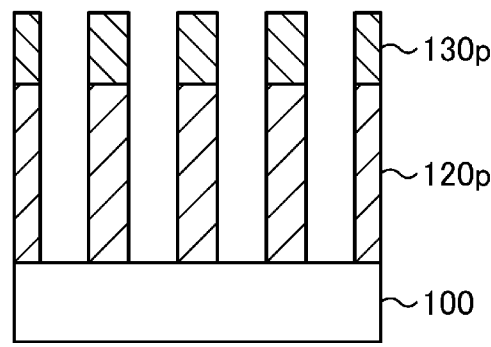
Figure 14B:
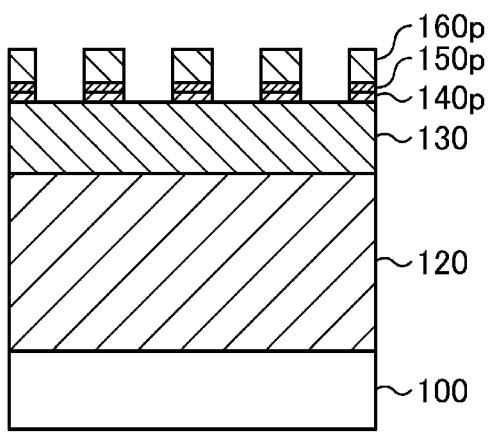

As illustrated in FIG. 14B, the residual resist film 160r and the adhesive film 150 between the projection patterns of the patterned resist 160p is removed by using anisotropic etching with, for example, oxygen plasma or the like. The adhesive film 150 thus becomes a patterned adhesive film 150p. Further, the SOG film 140 is etched by using the patterned resist 160p as a mask to form a SOG pattern 140p.

Figure 14E:
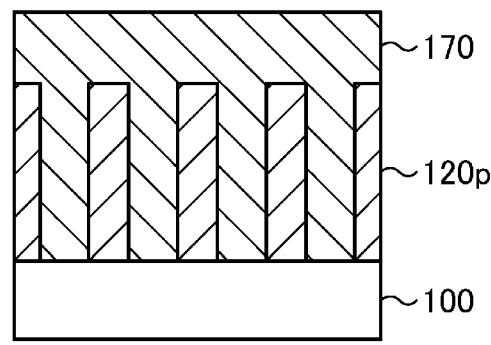
Figure 14C:
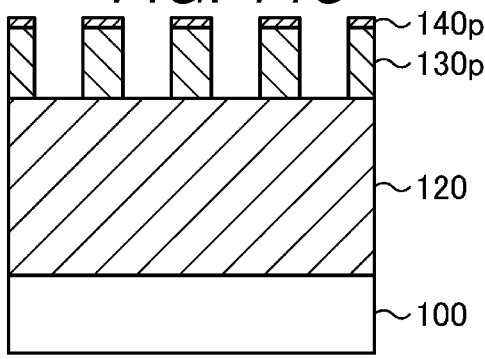

As illustrated in FIG. 14C, the SOC film 130 is etched by using the SOG pattern 140p as a mask to form an SOC pattern 130p. It is noted that the patterned resist 160p and the adhesive film 150p are organic films similar to the SOC pattern 130p. Thus, in this process, the patterned resist 160p and the adhesive film 150p are generally lost (removed).

As illustrated in FIG. 14D, the process target film 120 is etched by using the SOC pattern 130p as a mask to form a patterned process target film 120p. Then, the SOG pattern 140p on the SOC pattern 130p is removed. Also, a film thickness of the SOG pattern 140p may be adjusted or set in advance such that the SOG pattern 140p will be lost (removed) when the process target film 120p is etched. Thereafter, the SOC pattern 130p is removed by ashing using oxygen plasma.

As illustrated in FIG. 14E, a metal film 170 such as a tungsten film that covers the entire surface of the process target film 120p is formed. The metal film 170 is also filled into the pattern transferred to the process target film 120p.

Figure 14F:
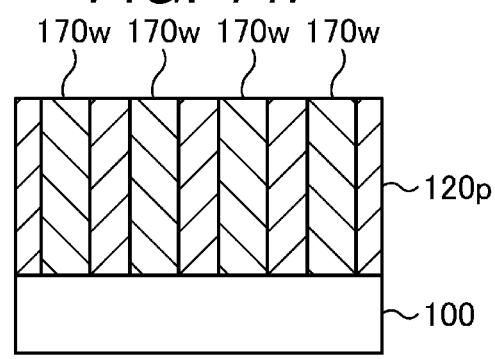

As illustrated in FIG. 14F, the metal film 170 on an upper surface of the process target film 120p is removed by chemical mechanical polishing (CMP) or the like. Thereby, wires 170w are formed in the pattern of the process target film 120p.

Thereafter, the semiconductor device according to the first embodiment is manufactured through various manufacturing processes.

Overview

In order to prevent bubbles from being mixed into or formed in a resist film during an imprint process, the resist film and a template may be surrounded by an atmosphere of inert gas such as helium gas or carbon dioxide gas when stamping the template on the resist film and curing the resist film.

However, the processing for a defective shot region may usually be skipped in the imprint process. Thus, the concentration of inert gas following a skipped shot may not be stable or sufficient in the next shot region to be imprinted. When inert gas is insufficient, bubbles may be mixed into a resist film of a shot region. When the inert gas is excessive, a protrusion-like resist defect may occur near a shot region edge, and a pattern defect, particles, or the like may be generated due to riding of extruded resist along a template edge or the like.

The cause of unstable concentration of inert gas in a shot following a skipped shot was investigated. It was seen that when a continuous imprint process is performed for adjacent shots, inert gas supplied from an outer edge portion side of a template is pulled to a position directly below the template during a release operation of the template for the previous shot, and thus, an imprint process for the next shot is generally performed in an atmosphere of inert gas of an appropriate concentration.

According to the imprint method of the first embodiment, the template 10 approaches the resist film 160, without coming into contact with the resist film 160, for the shots SHe determined to be defective by the preliminary inspection, and while supplying inert gas from an outer edge portion side of the template 10, the non-transfer process PRbr for separating the template 10 from the resist film 160 is performed.

Thereby, an operation of separating the template 10 is performed even for the shot SHe for which pattern transfer of the template 10 is not performed, and at that time, inert gas supplied from an outer edge portion side of the template 10 will be pulled to a position directly below the template 10 for the next shot SH. Therefore, an imprint process can be performed for the next shot SH after the shot She under an atmosphere of inert gas of an appropriate concentration.

Thus, bubbles can be prevented from being mixed into the resist film 160 of the next shot SH, the resist film 160 near the shot SH can also be prevented from protruding outwardly, and the patterned resist 160$p$ can be prevented from being defectively formed.

The template 10 only approaches the shot SHe without coming into contact with the resist film 160. Thus, the template 10 can be prevented from being contaminated by particles, foreign matter, or the like that may be in the shot SHe and therefor the template 10 and the wafer 30 can be prevented from being damaged by debris or the like.

Second Embodiment

An imprint process according to the second embodiment is different from the first embodiment in that a non-transfer process is also performed for at least some of missing (partial) shots disposed in a peripheral portion of a wafer.

It is noted that the imprint process according to the second embodiment can be performed by a control unit provided in an imprint device according to the second embodiment, for example, by controlling the imprint device 1 according to the first embodiment in the presently described manner. Thus, in the following, each unit excluding a control unit according to the second embodiment will be described by using the same reference numerals as components of the imprint device 1 of FIGS. 1A and 1B.

Method of Manufacturing Semiconductor Device

Next, a method of manufacturing a semiconductor device according to the second embodiment will be described with reference to FIGS. 15 to 22. The method of manufacturing the semiconductor according to the second embodiment includes an imprint process for the wafer 30.

The imprint process according to the second embodiment proceeds for the wafer 30 in generally the same manner as the first embodiment. However, in the imprint process according to the second embodiment, the non-transfer process PRbr is performed for the first shot SHp after a direction in which the process proceeds is reversed, in a process sequence of the step-and-repeat method, in addition to the shots SHe determined to be defective.

Figure 15:
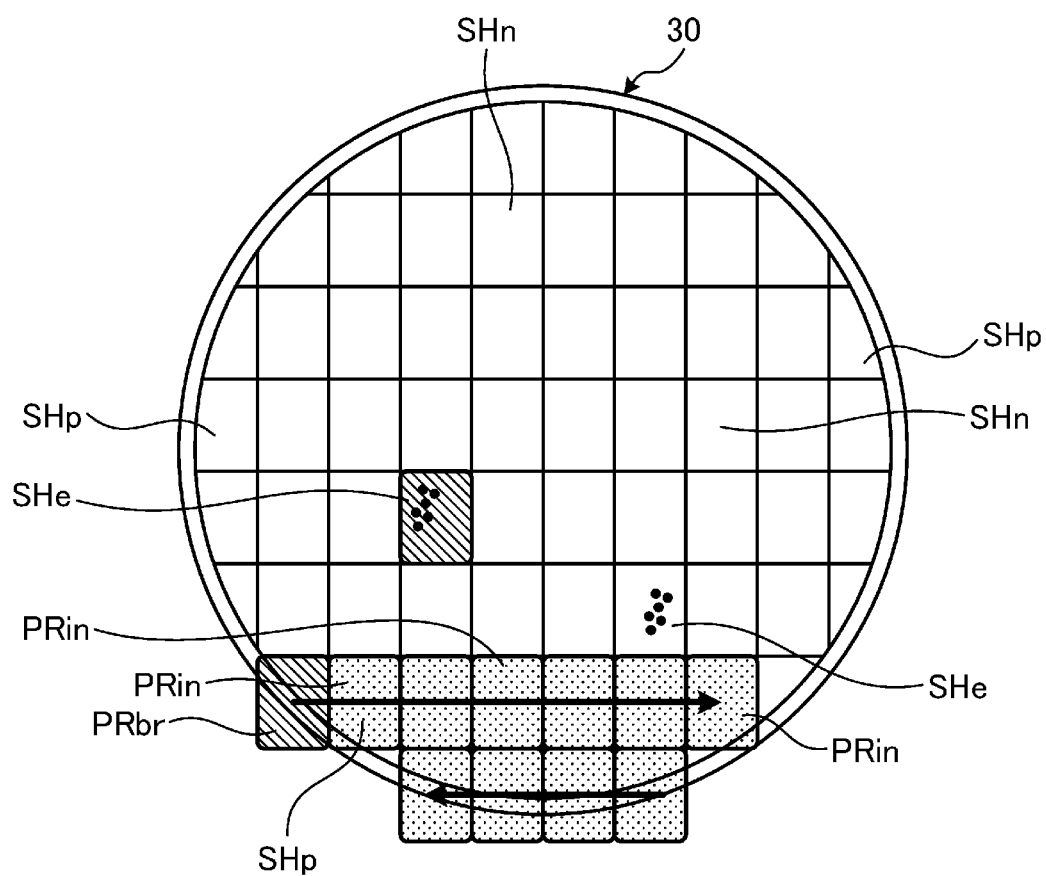
FIG. 15 depicts aspects of a method of manufacturing a semiconductor device according to a second embodiment.

As illustrated in FIG. 15, the transfer process PRin is sequentially performed for a plurality of shots SH in a lower end portion of the wafer 30, for example, from the right to the left as in the first embodiment, and then the transfer process PRin will be sequentially performed from the left to the right for the second row.

In first embodiment, the shot SHp at the left end of the second row is a missing shot that is a non-target shot having an area less than a predetermined area. In the second embodiment, the non-transfer process PRbr is performed for this shot SHp (the first shot SHp at the start/head of a new row) instead of this shot SHp being skipped over.

Figure 16:
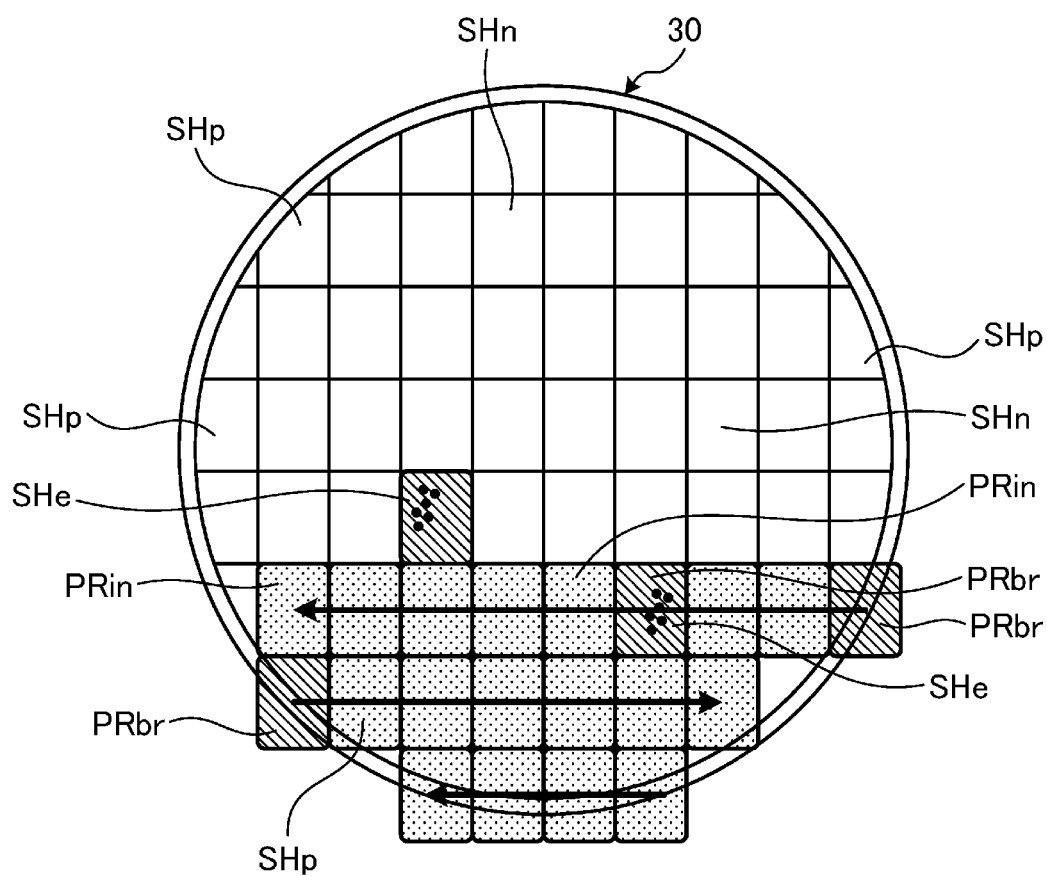
FIG. 16 depicts aspects of a method of manufacturing a semiconductor device according to the second embodiment.

As illustrated in FIG. 16, the transfer process PRin is to be next performed for shots SH in a third row from the right to the left. In the first embodiment, the shot SHp at the right end of the third row (which is a non-target shot having an area less than the predetermined area) is skipped. In the second embodiment, the non-transfer process PRbr is also performed for this shot SHp at the start/head of the third row.

Further, among the plurality of shots SH in the third row, there is a shot SHe determined to be defective. The non-transfer process PRbr is also performed for the shot She, which is the same as in the first embodiment described above.

The non-transfer process PRbr performed for the shot SHp in a peripheral portion of the wafer 30 is illustrated in cross-sectional views of FIGS. 17A, 17B, 18A, and 18B. The non-transfer process PRbr for the shot SHp is performed in substantially the same manner as the non-transfer process PRbr for the shots SHe according to the first embodiment.

Figure 17A:
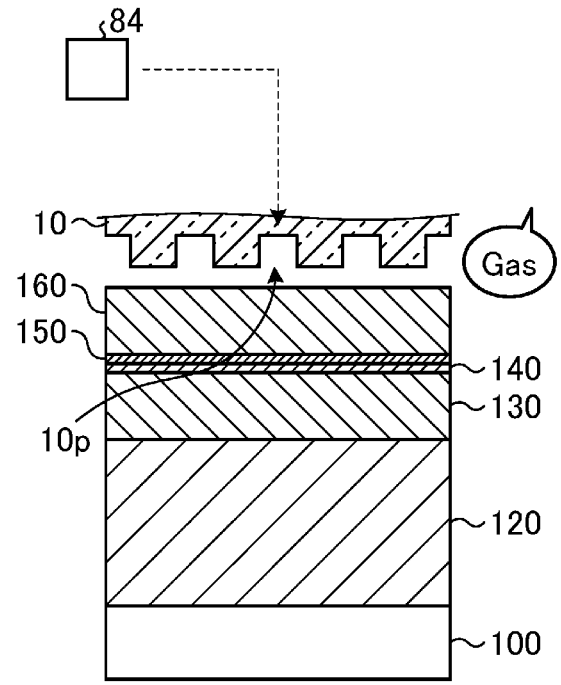
FIGS. 17A and 17B depict aspects of a method of manufacturing a semiconductor device according to the second embodiment.
Figure 17B:
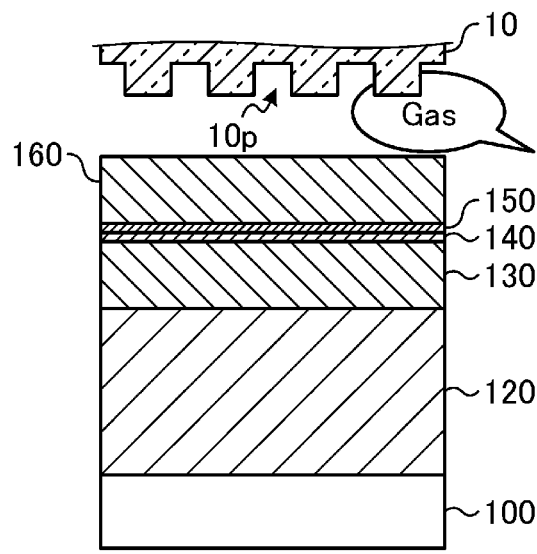

FIGS. 17A and 17B illustrate states where the non-transfer process PRbr is performed for the shot SHp at a left end of the second row.

As illustrated in FIG. 17A, a control unit of the imprint device according to the second embodiment moves the wafer stage 82, drops the template 10 on the shot SHp at the left end of the second row, and brings the template 10 close to (but not into contact with) the resist film 160 in the shot SHp.

The control unit supplies inert gas such as helium gas toward a lower portion from the shot SH side which is on a lower surface of the template stage 81 and for which an imprint process is to be performed next while the template 10 is close to the resist film 160.

In the example of FIG. 17A, the shot SH for which the imprint process is to be performed next is on the right side of the drawing. The control unit opens the valves 72 and 72$w$ (illustrated in FIG. 1) and ejects inert gas from the gas holes 74$w$ among the four gas holes 74$e$, 74$w$, 74$n$, and 74$s$ on the lower surface of the template stage 81.

As illustrated in FIG. 17B, the control unit raises the template 10 while continuously supplying inert gas from the gas hole 74$w$. Thereby, when the imprint process is performed next, and the template 10 moves above the shot SH on the right side of the drawing, a space between the next shot SH and the template 10 is in a high-concentration atmosphere of inert gas.

Figure 18A:
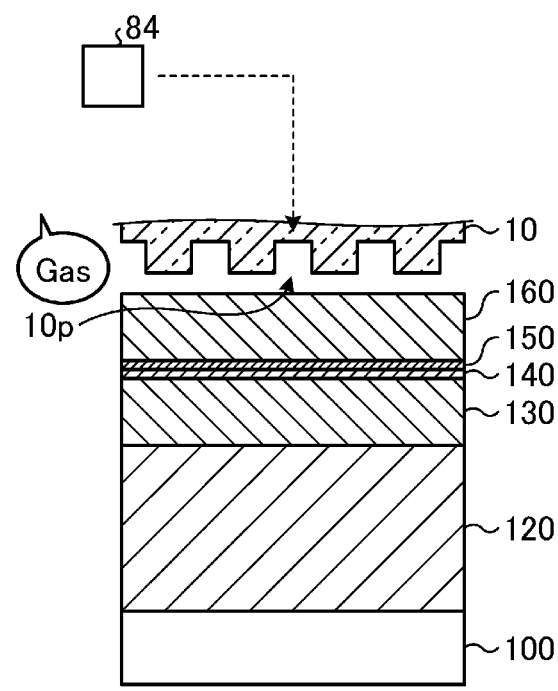
FIGS. 18A and 18B depict aspects of a method of manufacturing a semiconductor device according to the second embodiment.
Figure 18B:
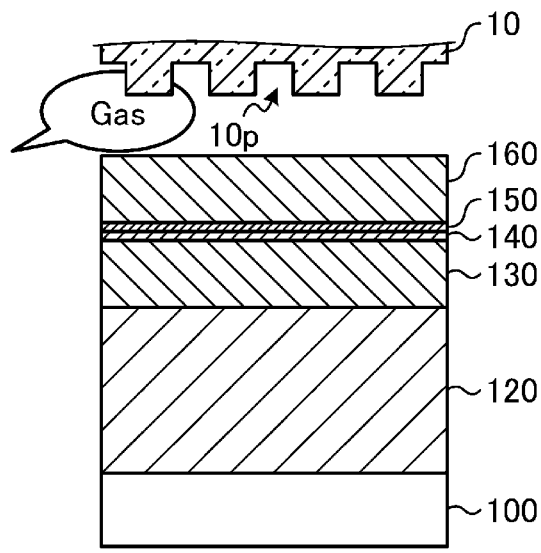

FIGS. 18A and 18B illustrate state where the non-transfer process PRbr is performed for the shot SHp at a right end of the third row.

As illustrated in FIG. 18A, the control unit moves the wafer stage 82, drops the template 10 on the shot SHp at the right end of the third row, and brings the template 10 close to (but not into contact with) the resist film 160 of the shot SHp.

The control unit also supplies inert gas toward a lower portion from the shot SH side which is on a lower surface of the template stage 81 and for which an imprint process is to be performed next, while the template 10 is close to the resist film 160.

In the example of FIG. 18A, the shot SH for which the imprint process is to be performed next is on the left side of the drawing. The control unit opens the valves 72 and 72$e$ (illustrated in FIG. 1A) and ejects inert gas from the gas holes 74$e$ among the four gas holes 74$e$, 74$w$, 74$n$, and 74$s$ on the lower surface of the template stage 81.

As illustrated in FIG. 18B, the control unit raises the template 10 while continuously supplying inert gas from the gas hole 74$e$. Thereby, when the imprint process is performed next, and the template 10 moves above the shot SH on the left side of the drawing, a space between the next shot SH and the template 10 is in a high-concentration atmosphere of inert gas.

Thereafter, as illustrated in plan views of FIGS. 19 to 22, the control unit repeats substantially the same operations to proceed with the imprint process.

Figure 19:
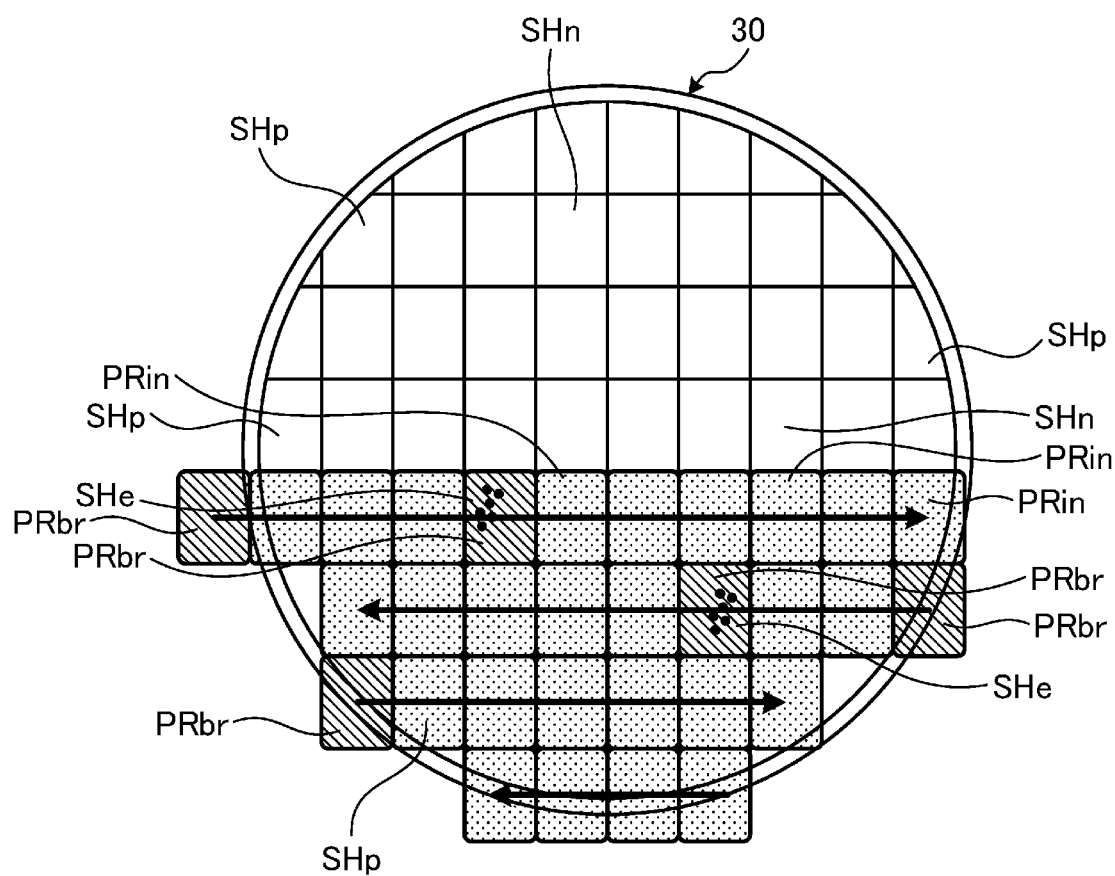
FIG. 19 depicts aspects of a method of manufacturing a semiconductor device according to the second embodiment.

As illustrated in FIG. 19, the imprint process is sequentially performed for the plurality of shots SH in a fourth row from the left to the right. In the first embodiment, the shot SHp at the left end is a target shot that is a target of the imprint process. Therefore, the transfer process PRin can be performed in this case for the shot SHp as in the first embodiment.

However, when the shot SH has such an arrangement, the non-transfer process PRbr may be preferably performed at a position outside the shot SHp at the left end of the fourth row (e.g., at a position substantially outside the wafer 30 circumference). Inert gas supplied from an outer edge portion side of the template 10 at an outer position of the shot SHp is ejected to the outermost edge portion of the wafer 30 outside the shot SHp and an upper surface of the wafer chuck 82b (see FIG. 1A) holding the wafer 30 and is pulled to a position directly below the template 10 by a pulling operation of the template 10.

Furthermore, among the plurality of shots SH in the fourth row, there is also a shot SHe determined to be defective. The non-transfer process PRbr is also performed for the shot SHe as in the first embodiment.

Figure 20:
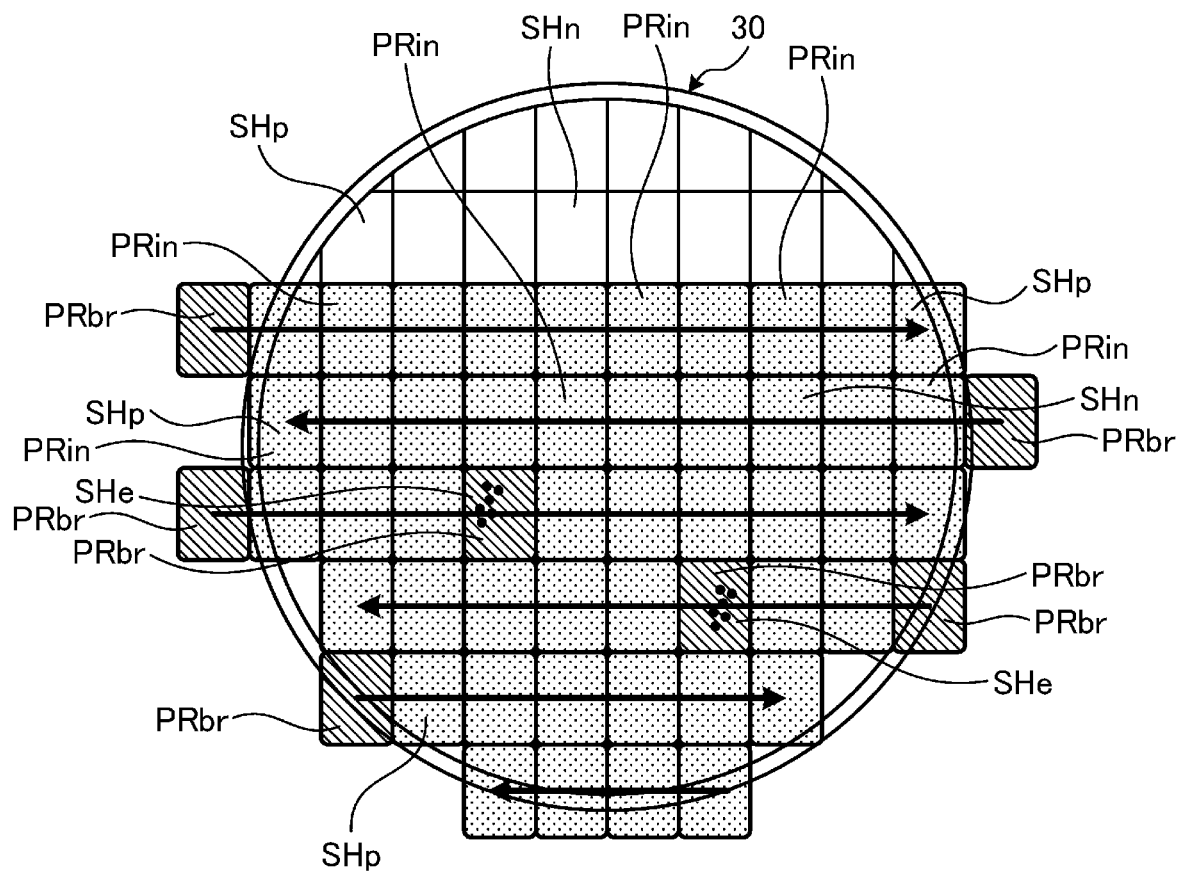
FIG. 20 depicts aspects of a method of manufacturing a semiconductor device according to the second embodiment.

As illustrated in FIG. 20, when an imprint process is performed for a plurality of shots SH in fifth and sixth rows, the non-transfer process PRbr is preferably performed at a position outside the shot SHp at the right end in the fifth row and at a position outside the shot SHp at the left end in the sixth row.

Figure 21:
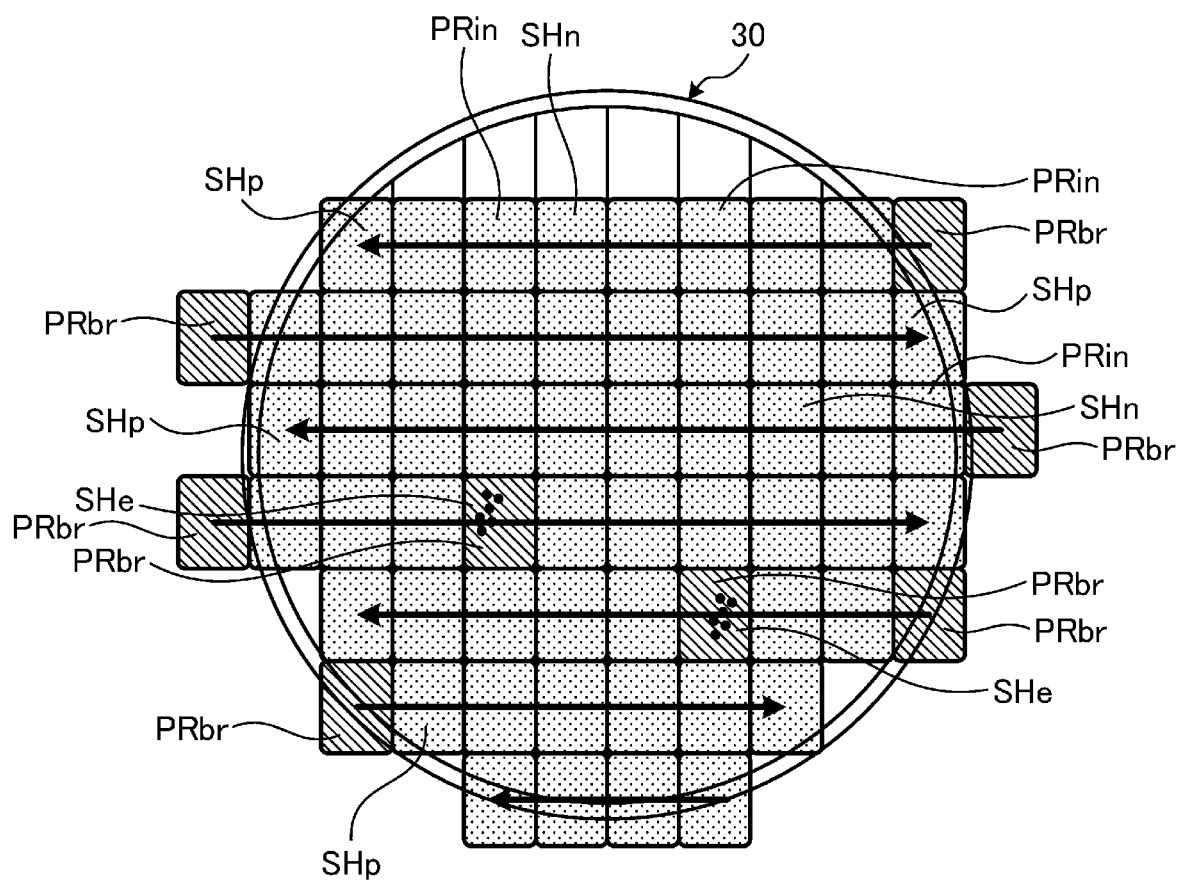
FIG. 21 depicts aspects of a method of manufacturing a semiconductor device according to the second embodiment.

As illustrated in FIG. 21, when an imprint process proceeds for a plurality of shots SH in a second row from an upper end portion of the wafer 30, the non-transfer process PRbr is performed for the shot SHp at the right end in the second row from the upper end portion.

Figure 22:
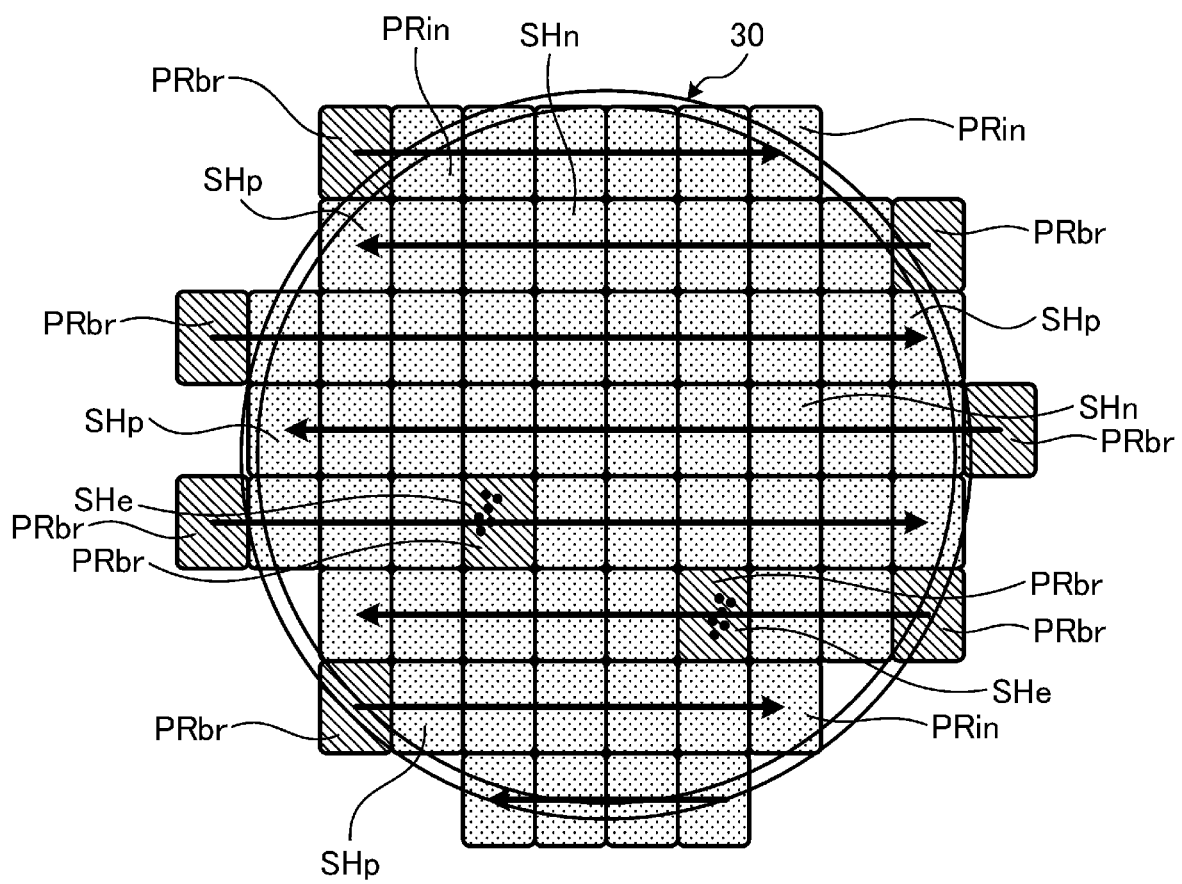
FIG. 22 depicts aspects of a method of manufacturing a semiconductor device according to the second embodiment.

As illustrated in FIG. 22, when an imprint process is performed for a plurality of shots SH in an upper end portion of the wafer 30, the non-transfer process PRbr is performed for the shot SHp at the left end in an upper end portion.

In this way, the transfer process PRin for all the shots SH which are targets of an imprint process ends. Further, among non-target shots of the wafer 30, the non-transfer process PRbr for the shot SHe determined to be defective ends.

Further, the non-transfer process PRbr ends for the first shot SHp after reversing a direction in which the imprint process proceeds among the shots SHp belonging to the non-target shots. All the other processes of the shot SHp are skipped.

Thereby, the imprint process according to the second embodiment for the wafer 30 ends.

Overview

As described above, inert gas is supplied from an outer edge portion side of a template in order to prevent bubbles from being entrained or formed in a resist film. The concentration of inert gas may be unstable in a target shot of a first imprint process after a reversing of direction in which the imprint process proceeds.

In order to avoid abnormality, it may be necessary to change or adjust the supply amount of inert gas according to a disposition position of a shot, such as vary gas flow rates for a shot region at a peripheral portion of a wafer or at shot region at an inner (central) portion of a wafer. However, even when the otherwise appropriate amount of the inert gas according to the disposition position of each shot is set in advance, further adjustment may be required in view of adjacent preceding non-target or skipped shots. The appropriate amount of the inert may likewise change depending on an ambient environment during an imprint process, a selected size of a shot, a change in the overall disposition of shots on the surface of a wafer, and the like, when a method of pulling (dragging) of the inert gas towards the next shot by releasing a template. In general, it takes lots of time and effort to specify the appropriate amount of inert gas to be supplied according to a change in an ambient environment, a size of a shot, the overall disposition of shots, and the like.

According to the imprint method of the second embodiment, the non-transfer process PRbr is also performed for each shot SHp that is disposed at a starting row end of the wafer 30. In this context, the shot SHp is a partially missing or incomplete shot area as compared to the normal shot SHn at some predetermined ratio or more and the starting row end is the first shot SHp after a process direction reversal when shifting between adjacent rows.

Thereby, an operation of separating the template 10 is performed before each shot SH which is a target of an imprint process, and inert gas supplied from an outer edge portion side of the template 10 can be pulled to a position directly below the template 10 for the target shot SH.

Therefore, bubbles can be prevented from being mixed into the resist film 160 of the first shot SH, the resist film 160 near the shot SH can be prevented from protruding, and the patterned resist 160p can be prevented from being defectively formed.

Further, the first shot SHp after reversing a direction in which a process proceeds just approaches the template 10 without coming into contact with the template 10. Thus, an imprint process can be prevented from being incompletely performed by forcibly pressing the template 10 against a shot SHp having a too small area.

Other Embodiments

In the first and second embodiments, the non-transfer process PRbr can be appropriately performed to prevent bubbles from being mixed into the resist film 160 without requiring any sort of complicated process such as individually adjusting the appropriate amount of inert gas supplied for each shot SH. However, even after such a complicated process to appropriately set the amount of inert gas supplied for each shot in advance, an imprint process including the non-transfer process PRbr may still be performed. Such an inclusion of the non-transfer process may enhance inert gas concentration stability for certain shots SH and bubbles can be further prevented from being mixed into the resist film 160.

In the first and second embodiments, the resist film 160 is coated on the wafer 30 by a coating device or the like that is separate or different from the imprint device. However, in other examples, the imprint device may include a film coating mechanism, and the resist film 160 may be coated in the imprint device prior to the imprint process.

In the first and second embodiments, the resist film 160 on a non-target shot can be exposed by an exposure device or the like that is separate or different from the imprint device. However, the imprint device may include such an exposure mechanism, and the resist film 160 may be exposed in the imprint device after an imprint process.

In the first and second embodiments, a control unit of an imprint device acquires information on non-target shots beforehand. However, the control unit of the imprint device may itself determine or identify the non-target shots based on layout information acquired by the design device 2 and/or an inspection result acquired by the inspection device 3.

In the first and second embodiments, a photocurable resin is used in the imprint process. However, in other examples, other resins such as thermosetting resins may be used in the imprint process. For example, when a thermosetting resin is used, an imprint device may include a heat source or the like as a curing unit instead of or in addition to the light source 89.

In the first and second embodiments, the imprint process by the imprint device is used for manufacturing a semiconductor device. However, the imprint process may also be used in other examples for manufacturing an electronic device such as a microelectromechanical system (MEMS), a magnetic recording device, a magnetic recording medium, or the like.

In the imprint process, a patterned resist having a plurality of different film thicknesses (e.g., multiple levels) can be formed by one resist film. Thus, the imprint process may be used to form a dual damascene structure having a wiring groove and a via, a structure having a step difference of a stair shape, and a structure of a lens shape.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An imprint method for a substrate having a plurality of shot regions, the method comprising:
   identifying target shot regions and non-target shot regions among the plurality of shot regions;
   performing a first process on each identified target shot region in the plurality of shot regions, the first process including:
      pressing a template against resin in the target shot region to transfer a pattern to the resin,
      curing the resin, and
      releasing the template from the cured resin while supplying inert gas towards the substrate from an outer edge side of the template; and
   performing a second process on each identified non-target shot region in the plurality of shot regions, the second process including:
      causing the template to approach the non-target shot region without coming into contact with resin in the non-target shot region, and
      moving the template away from the resin in the non-target shot region while supplying inert gas towards the substrate from the outer edge side of the template.

2. The imprint method according to claim 1, wherein the plurality of shot regions are processed such that shot regions adjacent to one another along a first direction are processed sequentially, with the second process being performed on any non-target shot regions that are before a target shot region in the sequence.

3. The imprint method according to claim 2, wherein the outer edge side of the template from which the inert gas is supplied is on a side of the template closest to the next shot region in the sequence along the first direction.

4. The imprint method according to claim 2, wherein the plurality of shot regions are arranged in a plurality of rows along the first direction, the rows being adjacent to each other in a second direction perpendicular to the first direction.

5. The imprint method according to claim 4, wherein the second process is performed on any non-target shot region at a beginning of any row in the sequence.

6. The imprint method according to claim 5, wherein the second process is not performed on any non-target shot region at an end of a row.

7. The imprint method according to claim 1, wherein a partial shot regions at an outer edge of the substrate are identified as non-target shot regions.

8. The imprint method according to claim 1, wherein a defective shot region identified in a preliminary inspection is identified as a non-target shot region.

9. The imprint method according to claim 1, wherein the inert gas is helium or carbon dioxide.

10. The imprint method according to claim 1, further comprising:
   performing a third process at a position adjacent to an outer peripheral shot region among the plurality of shot regions, the outer peripheral shot region being proximate to an outer edge of the substrate, the position being outside the outer edge of the substrate, the third process including:
      causing the template to approach, but not reach, a height level corresponding to a height level of resin in the outer peripheral shot region, and
      moving the template upward at the position while supplying inert gas downward from the outer edge side of the template, the outer edge side of the template being on a side nearest the outer peripheral shot region.

11. The imprint method according to claim 1, further comprising:
   processing the substrate using the pattern transferred to the resin in the target shot region as a mask.

12. The imprint method according to claim 11, wherein the processing of the substrate is an etch process.

13. The imprint method according to claim 1, wherein the resin is a photocurable resin.

14. The imprint method according to claim 1, wherein the identified non-target shot regions include a partial shot region formed at an outer peripheral portion of the substrate.

15. The imprint method according to claim 1, wherein the identified non-target shot regions include a shot region having defects identified in an inspection of the substrate.

16. An imprint device for imprinting a substrate having a plurality of shot regions, the imprint device comprising:
   a template stage to hold a template and position the template relative to a substrate such that the template can be above a shot region on the substrate;
   a gas supply unit that supplies gas from an outer edge side of the template on the template stage; and
   a control unit configured to:
      identify target shot regions and non-target shot regions among a plurality of shot regions on the substrate;
      perform a first process on each identified target shot region in the plurality of shot regions on the substrate, the first process including:

pressing the template held in the template stage against resin in the target shot region to transfer a pattern to the resin, controlling a curing unit to cure the resin, and releasing the template from the cured resin while controlling the gas supply unit to supply inert gas towards the substrate from the outer edge side of the template; and perform a second process on each identified non-target shot region in the plurality of shot regions, the second process including:

causing the template held in the template stage to approach the non-target shot region without coming into contact with resin in the non-target shot region, and moving the template held in the template stage away from the resin in the non-target shot region while controlling the gas supply unit to supply inert gas towards the substrate from the outer edge side of the template.

17. The imprint device according to claim 16, wherein the control unit is configured to process the plurality of shot regions such that shot regions adjacent to one another along a first direction are processed sequentially, with the second process being performed on any non-target shot regions that are before a target shot region in the sequence.

18. The imprint device according to claim 17, wherein the outer edge side of the template from which the inert gas is supplied is on a side of the template closest to the next shot region in the sequence along the first direction.

19. The imprint device according to claim 17, wherein the plurality of shot regions are arranged in a plurality of rows along the first direction, the rows being adjacent to each other in a second direction perpendicular to the first direction, and the second process is performed on any non-target shot region at a beginning of any row in the sequence.

20. The imprint device according to claim 16, wherein the control unit is further configured to:

perform a third process at a position adjacent to an outer peripheral shot region among the plurality of shot regions, the outer peripheral shot region being proximate to an outer edge of the substrate, the position being outside the outer edge of the substrate, the third process including:

causing the template held by the template stage to approach, but not reach, a height level corresponding to a height level of resin in the outer peripheral shot region, and moving the template held by the template stage upward at the position while controlling the gas supply unit to supply inert gas downward from the outer edge side of the template, the outer edge side of the template being on a side nearest the outer peripheral shot region.

* * * * *